(12) United States Patent
Xu et al.

(10) Patent No.: US 12,062,662 B2
(45) Date of Patent: *Aug. 13, 2024

(54) SEMICONDUCTOR DEVICES

(71) Applicant: Samsung Electronics Co., Ltd., Suwon-si (KR)

(72) Inventors: Yang Xu, Suwon-si (KR); Hyunkwan Yu, Suwon-si (KR); Namkyu Cho, Seongnam-si (KR); Dongmyoung Kim, Suwon-si (KR); Kanghun Moon, Hwaseong-si (KR); Sanggil Lee, Ansan-si (KR); Sihyung Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/142,210

(22) Filed: May 2, 2023

(65) Prior Publication Data
US 2023/0275091 A1 Aug. 31, 2023

Related U.S. Application Data

(63) Continuation of application No. 17/348,962, filed on Jun. 16, 2021, now Pat. No. 11,670,638.

(30) Foreign Application Priority Data

Oct. 13, 2020 (KR) .......................... 10-2020-0132052

(51) Int. Cl.
*H01L 27/092* (2006.01)
*H01L 29/78* (2006.01)

(52) U.S. Cl.
CPC ...... *H01L 27/0924* (2013.01); *H01L 29/7851* (2013.01)

(58) Field of Classification Search
CPC ............. H01L 27/0924; H01L 29/7851; H01L 21/823871; H01L 21/823814;
(Continued)

(56) References Cited

U.S. PATENT DOCUMENTS 9,825,036 B2 11/2017 Lee et al.
9,859,387 B2 1/2018 Kim et al.
(Continued)

FOREIGN PATENT DOCUMENTS

KR 20150044804 A 4/2015

*Primary Examiner* — Karen Kusumakar
*Assistant Examiner* — Adam S Bowen
(74) *Attorney, Agent, or Firm* — Myers Bigel, P.A.

(57) ABSTRACT

A semiconductor device includes a plurality of active fins extending in a first direction, and spaced apart from each other in a second direction, the plurality of active fins having upper surfaces of different respective heights, a gate structure extending in the second across the plurality of active fins, a device isolation film on the substrate, a source/drain region on the plurality of active fins, and including an epitaxial layer on the plurality of active fins, an insulating spacer on an upper surface of the device isolation film and having a lateral asymmetry with respect to a center line of the source/drain region in a cross section taken along the second direction, an interlayer insulating region on the device isolation film and on the gate structure and the source/drain region, and a contact structure in the interlayer insulating region and electrically connected to the source/drain region.

20 Claims, 21 Drawing Sheets

(58) Field of Classification Search
CPC ..... H01L 21/823821; H01L 21/823878; H01L 21/823431; H01L 21/823418; H01L 21/823437; H01L 21/823475; H01L 21/823481; H01L 29/785
See application file for complete search history.

(56) References Cited

U.S. PATENT DOCUMENTS

| | | |
|---|---|---|
| 10,032,910 B2 | 7/2018 | Wu et al. |
| 10,243,045 B2 | 3/2019 | Yu et al. |
| 10,269,932 B1 | 4/2019 | Arya et al. |
| 10,297,690 B2 | 5/2019 | Li et al. |
| 10,388,791 B2 | 8/2019 | Kim et al. |
| 10,516,037 B2 | 12/2019 | Lee et al. |
| 10,546,784 B2 | 1/2020 | Lee et al. |
| 2015/0108544 A1 | 4/2015 | Ching et al. |
| 2016/0268257 A1 | 9/2016 | Lim et al. |
| 2016/0288065 A1 | 10/2016 | Markle et al. |
| 2018/0151671 A1 | 5/2018 | Jung et al. |
| 2018/0358358 A1 | 12/2018 | Yu et al. |
| 2019/0067451 A1* | 2/2019 | Ching .................. H10B 99/00 |
| 2019/0273023 A1 | 9/2019 | Loh et al. |
| 2019/0287859 A1 | 9/2019 | Huang |
| 2019/0378752 A1 | 12/2019 | Hsieh et al. |
| 2020/0168735 A1 | 5/2020 | Yu et al. |
| 2021/0408286 A1 | 12/2021 | More et al. |

* cited by examiner

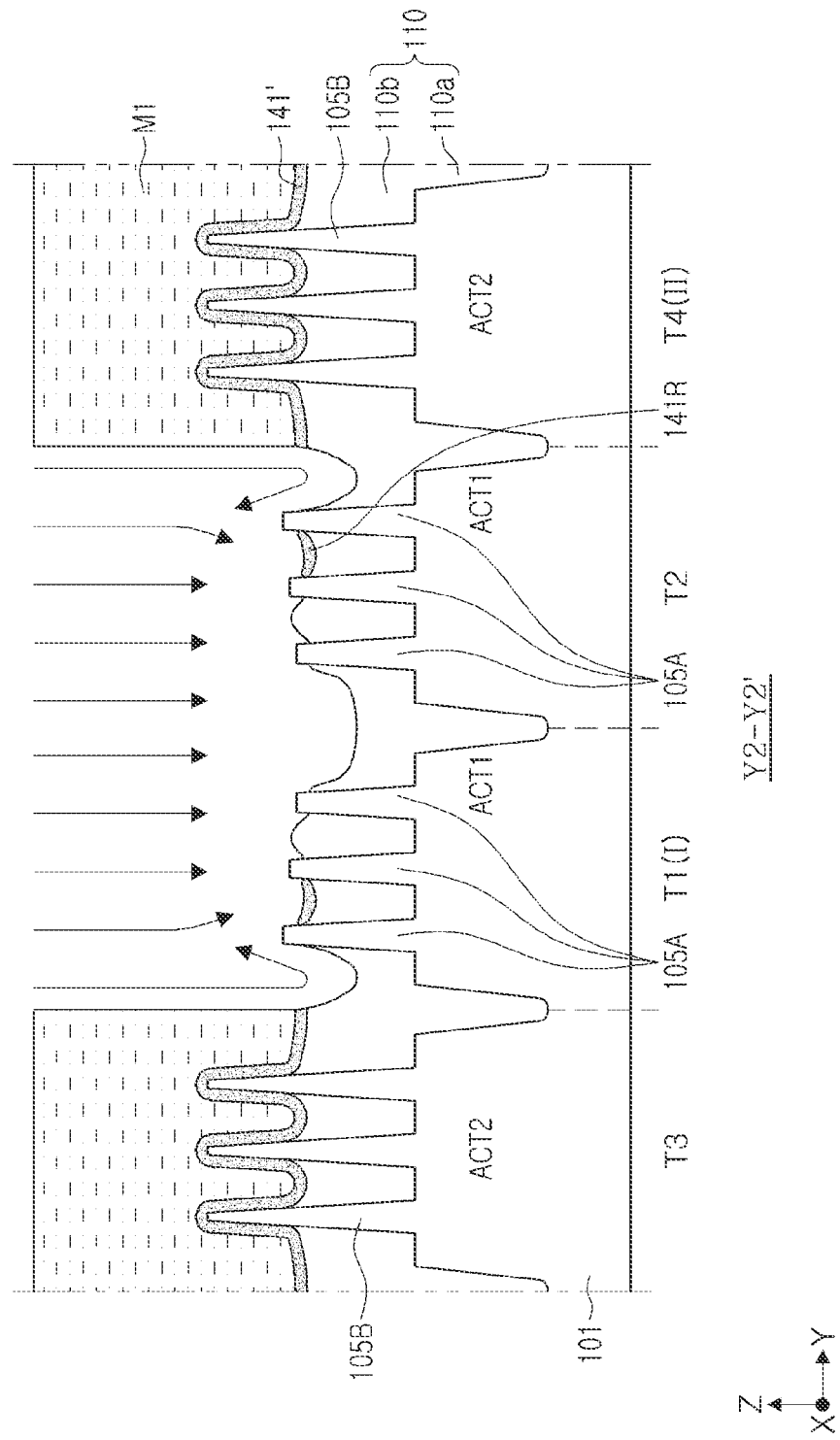

SEMICONDUCTOR DEVICES

CROSS-REFERENCE TO RELATED APPLICATION(S)

The present application is a continuation of, and claims priority under 35 U.S.C. § 120 to, U.S. patent application Ser. No. 17/348,962 filed Jun. 16, 2021, which, in turn, claims priority to Korean Patent Application No. 10-2020-0132052, filed on Oct. 13, 2020 in the Korean Intellectual Property Office, the entire disclosure of which is incorporated herein by reference for all purposes.

BACKGROUND

The present disclosure relates to semiconductor devices. While demand for high performance, high speed and/or multifunctionality in semiconductor devices is increasing, demand for high integration of semiconductor devices is also increasing. To meet the demand for high integration of semiconductor devices, the development of semiconductor devices having a three-dimensional channel structure is being actively undertaken.

SUMMARY

Example embodiments provide a highly integrated semiconductor device.

According to example embodiments, a semiconductor device includes a substrate; a plurality of active fins on an active region of the substrate, the plurality of active fins extending in a first direction, spaced apart from each other in a second direction intersecting the first direction, and having upper surfaces of different respective heights; a gate structure extending in the second direction while traversing the plurality of active fins; a device isolation film on an upper surface of the active region and side surfaces of the plurality of active fins; a source/drain region on the plurality of active fins, on at least one side of the gate structure, and including an epitaxial layer on the plurality of active fins; an insulating spacer on an upper surface of the device isolation film and having a lateral asymmetry with respect to a center line of the source/drain region in a cross section taken along the second direction; an interlayer insulating region on the device isolation film and on the gate structure and the source/drain region; and a contact structure in the interlayer insulating region and electrically connected to the source/drain region.

According to example embodiments, a semiconductor device includes first and second active regions adjacent to each other on a substrate and having a first conductivity-type impurity; a plurality of first active fins and a plurality of second active fins on the first and second active regions, respectively, the plurality of first active fins and the plurality of second active fins extending in a first direction and having a pitch of 40 nanometers (nm) or less in a second direction intersecting the first direction; a device isolation film on upper surfaces of the first and second active regions and side surfaces of the plurality of first active fins and the plurality of second active fins; a first source/drain region on the plurality of first active fins and including a first epitaxial layer on the plurality of first active fins; a second source/drain region on the plurality of second active fins and including a second epitaxial layer on the plurality of second active fins; an interlayer insulating region on the device isolation film and on the first and second source/drain regions; and first and second contact structures in the interlayer insulating region, and electrically connected to the first and second source/drain regions, respectively. An active fin among the plurality of first active fins and an active fin among the plurality of second active fins may be adjacent each other and may have respective upper surfaces lower than upper surfaces of other active fins among the plurality of first active fins and the plurality of second active fins.

According to example embodiments, a semiconductor device includes an active region on a substrate; a first active fin and a second active fin on the active region, the first active fin and the second active fin extending in a first direction and spaced apart from each other in a second direction intersecting the first direction, the second active fin having an upper surface higher than an upper surface of the first active fin; a device isolation film on an upper surface of the active region and side surfaces of the first and second active fins; a source/drain region on the first and second active fins and including an epitaxial layer on the first and second active fins; an interlayer insulating region on the device isolation film and on the source/drain region; and a contact structure in the interlayer insulating region and electrically connected to the source/drain region.

BRIEF DESCRIPTION OF DRAWINGS

The above and other aspects, features, and advantages of the present inventive concept will be more clearly understood from the following detailed description, taken in conjunction with the accompanying drawings, in which:

FIGS. 6A to 6D are cross-sectional views for each process to illustrate the process illustrated in FIG. 5D in detail;

DETAILED DESCRIPTION

Hereinafter, example embodiments will be described with reference to the accompanying drawings.

Figure 1:
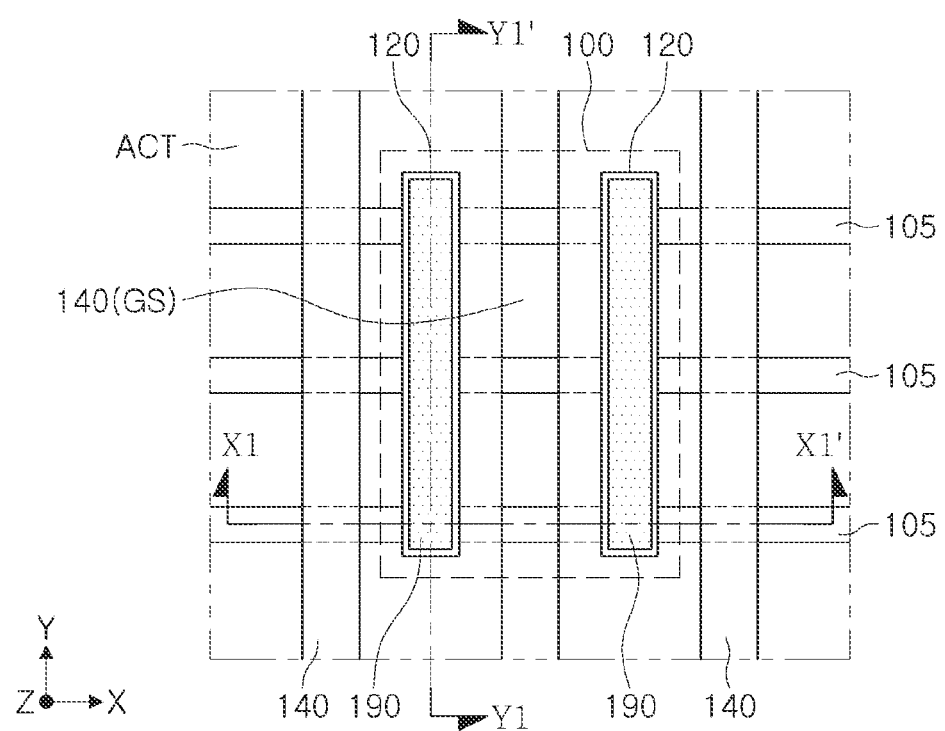
FIG. 1 is a plan view illustrating a semiconductor device according to an example embodiment.
Figure 2A:
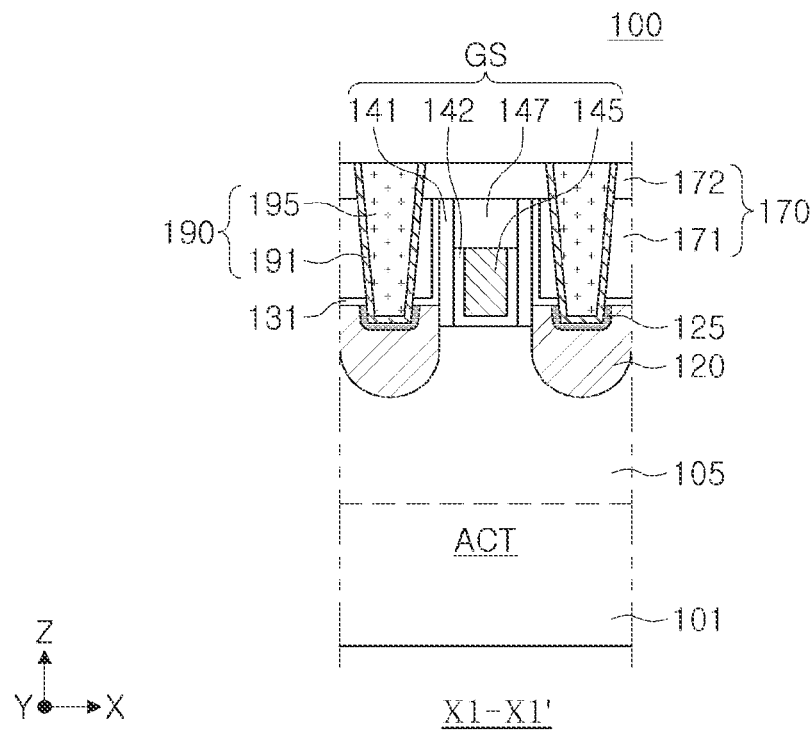
FIGS. 2A and 2B are cross-sectional views of the semiconductor device illustrated in FIG. 1, taken along lines X1-X1' and Y1-Y1', respectively.
Figure 2B:
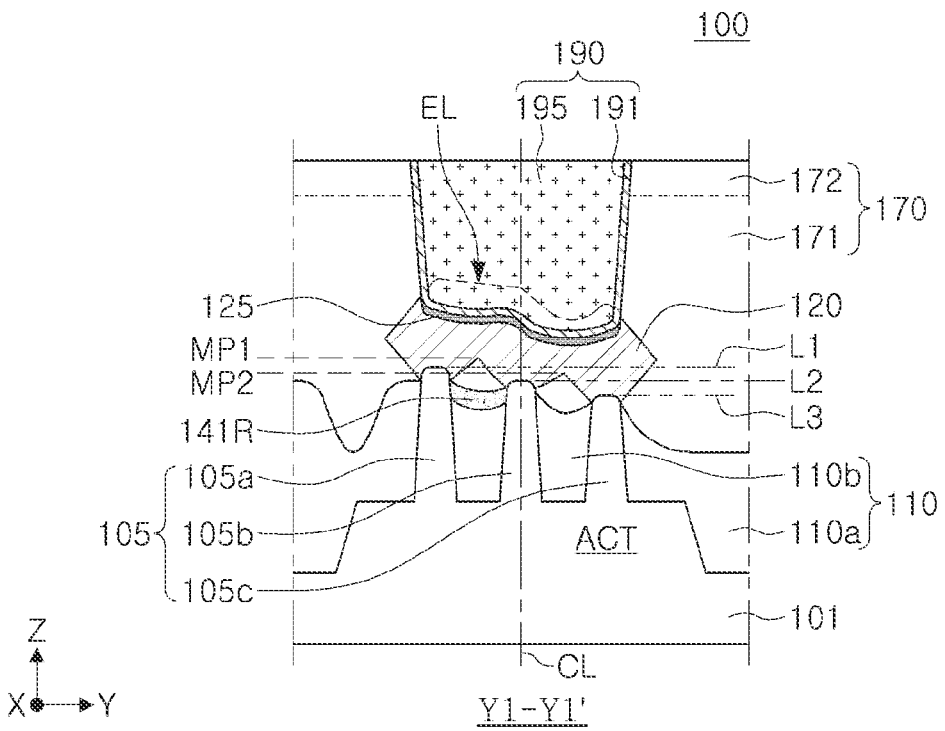

FIG. 1 is a plan view illustrating a semiconductor device according to an example embodiment, and FIGS. 2A and 2B are cross-sectional views of the semiconductor device illustrated in FIG. 1, taken along lines X1-X1' and Y1-Y1', respectively.

Referring to FIGS. 1, 2A and 2B, a semiconductor device 100 according to an example embodiment includes a substrate 101 having an active region ACT, a plurality of active fins 105 extending in a first direction (e.g., X direction) parallel to an upper surface of the active region ACT, and a gate structure (GS) 140 extending in a second direction (e.g., Y direction) different from the first direction, on the plurality of active fins 105.

The substrate 101 may include a group IV semiconductor such as silicon (Si) or germanium (Ge), a group IV-IV compound semiconductor such as SiGe or silicon carbide (SiC), or a group III-V compound semiconductor such as gallium arsenide (GaAs), indium arsenide (InAs) or indium phosphide (InP). The substrate 101 includes the active region ACT. The active region ACT may be a conductive region such as a well doped with impurities or a structure doped with impurities. For example, the active region ACT may be an N-type well for a PMOS transistor.

A device isolation film 110 defines an active region ACT and active fins 105. For example, the device isolation film 110 may include an insulating material such as silicon oxide. The device isolation film 110 may include a first isolation region 110a defining the active region ACT and a second isolation region 110b defining the active fins 105. The first isolation region 110a may have a deeper bottom surface than the second isolation region 110b. For example, the first isolation region 110a is also referred to as deep trench isolation (DTI), and the second isolation region 110b is also referred to as shallow trench isolation (STI). The second isolation region 110b may be disposed on the active region ACT. The active fins 105 penetrate the second isolation region 110b, and a portion of the active fins 105 may protrude upward beyond the upper surface of the second isolation region 110b.

As described above, the plurality of active fins 105 may be disposed on an upper surface of the active region ACT. The plurality of active fins 105 may have a structure protruding from an upper surface of the active region ACT in a third direction (e.g., Z direction) perpendicular to the first and second directions. In this embodiment, the active fins 105 are illustrated as comprising three fins protruding upward from the active region ACT, but the active fins 105 may also be formed in another plural number, for example, two or four or more. Referring to FIGS. 1 and 2B, three active fins 105 are arranged side by side in the second direction (e.g., Y direction) in the active region ACT, and may each extend longitudinally in the first direction (e.g., X direction).

The active fins 105 employed in this embodiment may be arranged at a pitch of 40 nanometers (nm) or less. In some embodiments, the pitch of the active fins 105 may be 30 nm or less. Such conditions such as fine pitch may have a correlation with asymmetry to be described in this embodiment (see FIGS. 7A to 7D).

As illustrated in FIG. 1, a gate structure GS may have a linear structure extending in a second direction (Y direction) intersecting the first direction (X direction). The gate structure GS may contact some of the active fins 105. The gate structure GS may include gate spacers 141, a gate insulating layer 142 and a gate electrode 145 sequentially disposed between the gate spacers 141, and a gate capping layer 147 disposed on the gate electrode 145.

The gate electrode 145 may include doped polysilicon, metal, conductive metal nitride, conductive metal carbide, or combinations thereof. For example, the gate electrode 145 may be formed of aluminum (Al), copper (Cu), titanium (Ti), tantalum (Ta), tungsten (W), molybdenum (Mo), tantalum nitride (TaN), nickel silicide (NiSi), cobalt silicide (CoSi), titanium nitride (TiN), tungsten nitride (WN), titanium aluminide (TiAl), titanium aluminum nitride (TiAlN), tantalum carbon nitride (TaCN), tantalum carbide (TaC), tantalum silicon nitride (TaSiN), or combinations thereof, but the material thereof is not limited thereto.

The gate insulating layer 142 is disposed on a bottom surface and a sidewall of the gate electrode 145 and may extend in the second direction (Y direction) along the bottom surface of the gate electrode 145. The gate insulating layer 142 may be interposed between the gate electrode 145 and the active fins 105, and between the gate electrode 145 and the upper surface of the device isolation film 110. For example, the gate insulating layer 142 may include silicon oxide ($SiO_x$), silicon nitride ($SiN_x$), silicon oxynitride ($SiO_xN_y$), a high dielectric film having a higher dielectric constant than a silicon oxide film, or combinations thereof. The high dielectric film may include metal oxide or metal oxynitride. For example, the high dielectric film usable as the gate insulating layer 142 may include hafnium oxide ($HfO_2$), hafnium silicon oxide (HfSiO), hafnium silicon oxynitride (HfSiON), hafnium tantalum oxide (HMO), hafnium titanium oxide (HMO), hafnium zirconium oxide (HfZrO), zirconium oxide ($ZrO_2$), aluminum oxide ($Al_2O_3$), or combinations thereof, but the material is not limited thereto.

The gate capping layer 147 may be disposed on the gate electrode 145. The gate capping layer 147 may cover an upper surface of the gate electrode 145 and may extend in the second direction (Y direction). For example, the gate capping layer 147 may include silicon nitride or silicon oxynitride. The gate spacers 141 may be disposed on opposite sidewalls of the gate electrode 145 and on opposite sidewalls of the gate capping layer 147. The gate spacer 141 may extend in the extending direction of the gate electrode 145, on opposite sidewalls of the gate electrode 145, and the gate insulating layer 142 may be interposed between the gate electrode 145 and the gate spacer 141. For example, the gate spacer 141 may include silicon oxide ($SiO_x$), silicon nitride ($SiN_x$), silicon oxynitride ($SiO_xN_y$), silicon carbonitride ($SiC_xN_y$), silicon oxycarbonitride ($SiO_xC_yN_z$), or combinations thereof. In some embodiments, the gate spacer 141 may include a plurality of layers formed of different materials. FIG. 2A illustrates that the gate spacer 141 is configured as a single layer, but unlike this, the gate spacer 141 may include a plurality of spacer layers sequentially stacked on the sidewall of the gate electrode 145 and having different dielectric constants.

The semiconductor device 100 according to this embodiment may include source/drain regions 120 disposed in portions of the active fins 105 located on opposite sides of the gate structure GS.

The source/drain regions 120 are formed in recessed regions of the active fins 105. The source/drain region 120 may include an epitaxial layer obtained by selective epitaxial growth (SEG) in the recessed region of the active fin 105. The source/drain regions 120 may include Si, SiGe, or Ge, and the source/drain regions 120 may have different materials or different shapes, depending on whether the source/drain regions 120 are part of an N-type transistor or a P-type transistor (e.g., a P-type MOSFET).

An etch stop layer 131 may be disposed on a sidewall of the gate structure GS and on the source/drain regions 120 and the device isolation film 110. The etch stop layer 131 may be conformally disposed on the sidewalls of the source/drain regions 120. For example, the etch stop layer 131 may include silicon nitride.

The semiconductor device 100 according to this embodiment is a P-type transistor, and the source/drain regions 120 may include silicon-germanium (SiGe), and may be doped with P-type impurities (e.g., boron (B), indium (In), gallium (Ga)). A cross section (Y-Z cross section, see FIG. 2B) of the source/drain regions 120 may have a pentagonal shape. In this manner, the source/drain regions 120 may constitute a 3D semiconductor device such as a Fin-FET, together with the active fin 105 and the gate structure GS.

The upper surface of the plurality of active fins 105 may be a recessed upper surface in which the source/drain regions 120 are formed, as illustrated in FIG. 2B, unless otherwise specified herein. The plurality of active fins 105 include first to third active fins 105a, 105b and 105c arranged side by side in a second direction, and recessed upper surfaces of the first to third active fins 105a, 105b and 105c may have different heights (or levels). In this case, the term "height" (or "level") may be defined as a height in a third direction perpendicular to the upper surface of the substrate with respect to the upper surface of the substrate.

Referring to FIG. 2B, the upper surface of the first active fin 105a located on one side has a highest level L1, and the third active fin 105c located on the other side has a lowest level L3. An upper surface level L2 of the second active fin 105b may be lower than the highest level L1 of the first active fin 105a and higher than the highest level L3 of the third active fin 105c. In this manner, the first to third active fins may be arranged in an order in which the upper surface levels are gradually lowered in one direction. The present inventive concept is not limited thereto, and in other embodiments, the upper surface level L2 of the second active fin 105b may be similar to the upper surface level L1 or L3 of the first or third active fins 105a or 105c.

An insulating spacer 141R may be on a portion of the upper surface of the device isolation film 110. In some embodiments, the insulating spacer may be formed of the same material as or similar to at least some layers of the gate spacer 141. For example, the insulating spacer 141R may include silicon nitride ($SiN_x$), silicon oxynitride ($SiO_xN_y$), silicon carbonitride ($SiC_xN_y$), silicon oxycarbonitride ($SiO_xC_yN_z$), or combinations thereof.

In the cross section of FIG. 2B, the insulating spacers 141R may be arranged laterally asymmetrically with respect to the center line of the source/drain region. In this case, the center line CL of the source/drain region 120 may be a vertical line passing through the center (in this embodiment, the center of the second active fin 105b located in the middle) of the arrangement of the active fins 105 in the third direction (Z direction).

The insulating spacer 141R is disposed on an area adjacent to the first active fin 105a, on the upper surface of the device isolation film 110, but may not be disposed on at least an area (also referred to as an "outer area") adjacent to an outer side of the third active fin 105c, on the upper surface of the device isolation film 110. Referring to FIG. 2B, the insulating spacer 141R may be disposed on a region between the first and second active fins 105a and 105b, on the upper surface of the device isolation film 110. However, the insulating spacer 141R may not be disposed in an outer region of the third active fin 105c and a region between the second and third active fins 105b and 105c, on the upper surface of the device isolation film 110. In some embodiments, a portion of the insulating spacer 141R may also be disposed in an outer region (a side far from the second active fin 105b) of the first active fin 105a (see FIG. 8). In addition, in some other embodiments, an asymmetrical arrangement of the insulating spacers 141R has been described as being implemented in a partial arrangement as in this embodiment, but may be implemented with a difference in thickness of the insulating spacers 141R. In an example of such an asymmetrical arrangement, a portion of the insulating spacer 141R is also present in the region between the second and third active fins 105b and 105c, but the thickness of the portion may be less than the thickness of a portion located in the area between the first and second active fins 105a and 105b.

The source/drain region 120 includes respective epitaxial layers grown over the first to third active fins 105a, 105b and 105c having different heights. The epitaxial portions regrown from the respective first to third active fins 105a, 105b and 105c may be merged with each other to form one continuous epitaxial layer.

Referring to the cross section of FIG. 2B, the source/drain regions 120 according to this embodiment may have a laterally asymmetrical structure with respect to the center line CL of the source/drain region 120. This asymmetrical structure may appear as a shape or level difference in merged portions of the source/drain region 120, for example, in bottom surfaces of a region between adjacent active fins 105. In detail, as illustrated in FIG. 2B, a highest point MP1 of the bottom surface of the source/drain region 120, between the first and second active fins 105a and 105b, may be higher than a highest point MP2 of the bottom surface of the source/drain region 120, between the second and third active fins 105b and 105c.

The dotted line EL represents an upper surface line of the epitaxial layer for the source/drain region 120 before forming a contact structure 190. This epitaxial layer is merged to have a substantially flat upper surface between the first and second active fins 105a and 105b, but is not completely merged between the second and third active fins 105b and 105c to have a relatively curved surface. The profile of the lower surface of the contact structure 190 may also be changed by the upper surface of the epitaxial layer. As illustrated in FIG. 2B, a lower surface of the contact structure 190 may be formed such that a portion thereof adjacent to the third active fin 105c is lower than a portion adjacent to the first active fin 105a.

In this manner, not only the upper surface levels of the active fins 105 are different, but the insulating spacers 141R are asymmetrically arranged (or distributed) based on the center line CL of the source/drain region 120, or the source/drain regions 120 may also have an asymmetrical structure.

The semiconductor device 100 according to this embodiment may include a contact structure 190 in (e.g., penetrating) an interlayer insulating portion 170 and electrically connected to the source/drain region 120. Although not illustrated, similar to the contact structure 190, an additional contact structure (not illustrated) in (e.g., penetrating) the interlayer insulating portion 170 and electrically connected to the gate electrode 145 of the gate structure GS may be included. The interlayer insulating portion 170 may also be referred to herein as an interlayer insulating "region."

The interlayer insulating portion 170 may include an inter-gate insulating layer 171 and a capping insulating layer 172 sequentially disposed on the source/drain regions 120. The inter-gate insulating layer 171 is disposed between the adjacent gate structures GS and may cover the source/drain regions 120 and the device isolation film 110. The inter-gate insulating layer 171 may have an upper surface substantially coplanar with upper surfaces of the gate spacer 141 and the gate capping layer 147. For example, at least one of the inter-gate insulating layer 171 and the capping insulating layer 172 may include silicon nitride, silicon oxide, or silicon oxynitride. In some embodiments, the inter-gate insulating layer 171 may be formed of Tetra Ethyl Ortho Silicate (TEOS), Undoped Silicate Glass (USG), Phospho-Silicate Glass (PSG), Borosilicate Glass (BSG), BoroPhosphoSilicate Glass (BPSG), Fluoride Silicate Glass (FSG), Spin On Glass (SOG), Tonen SilaZene (TOSZ), or combinations thereof. At least one of the inter-gate insulating layer 171 and the capping insulating layer 172 may be formed using a chemical vapor deposition (CVD) or spin coating process.

In this embodiment, the contact structure 190 may include a conductive barrier 191, and a contact plug 195 disposed on the conductive barrier 191. As described above, the contact structure may be formed in a region (refer to the dotted line 'EL') in which a portion of the epitaxial layer for the source/drain region 120 has been recessed. The contact structure 190 may form a metal silicide layer 125 in the contact area of the source/drain region 120 to improve the contact resistance with the source/drain region 120. For example, the metal silicide layer 125 may be formed of a material such as CoSi, NiSi, titanium silicide (TiSi), nickel platinum silicide (NiPtSi), or nickel titanium silicide (NiTiSi). In some embodiments, the conductive barrier 191 may be a conductive metal nitride film. For example, the conductive barrier 191 may include TiN, TaN, aluminum nitride (AlN), WN, and combinations thereof. The contact plug 195 may include tungsten (W), cobalt (Co), titanium (Ti), alloys thereof, or combinations thereof.

The structural features described above (the height of the active fins, the asymmetrical arrangement and/or structure) may be closely related to the scaling down of the semiconductor device. For example, the above-described features may be clearly provided under the condition that the pitch of the active fins is 40 nm or less, which may be due to the specificity of the etchant flow in the micronized etching space in the process for forming the source/drain regions (in detail, the recess etching process of the active fins) (see FIG. 7B).

On the other hand, since the recess etching may be applied differently for respective device regions (e.g., depending on whether a P-MOSFET or an N-MOSFET is used), these structural features may have different trends for respective device regions. For example, the above-described structural features may be more pronounced in a P-MOSFET region to which recess etching is sufficiently applied than in an N-MOSFET region. This embodiment is illustrated in FIGS. 3 and 4.

Figure 3:
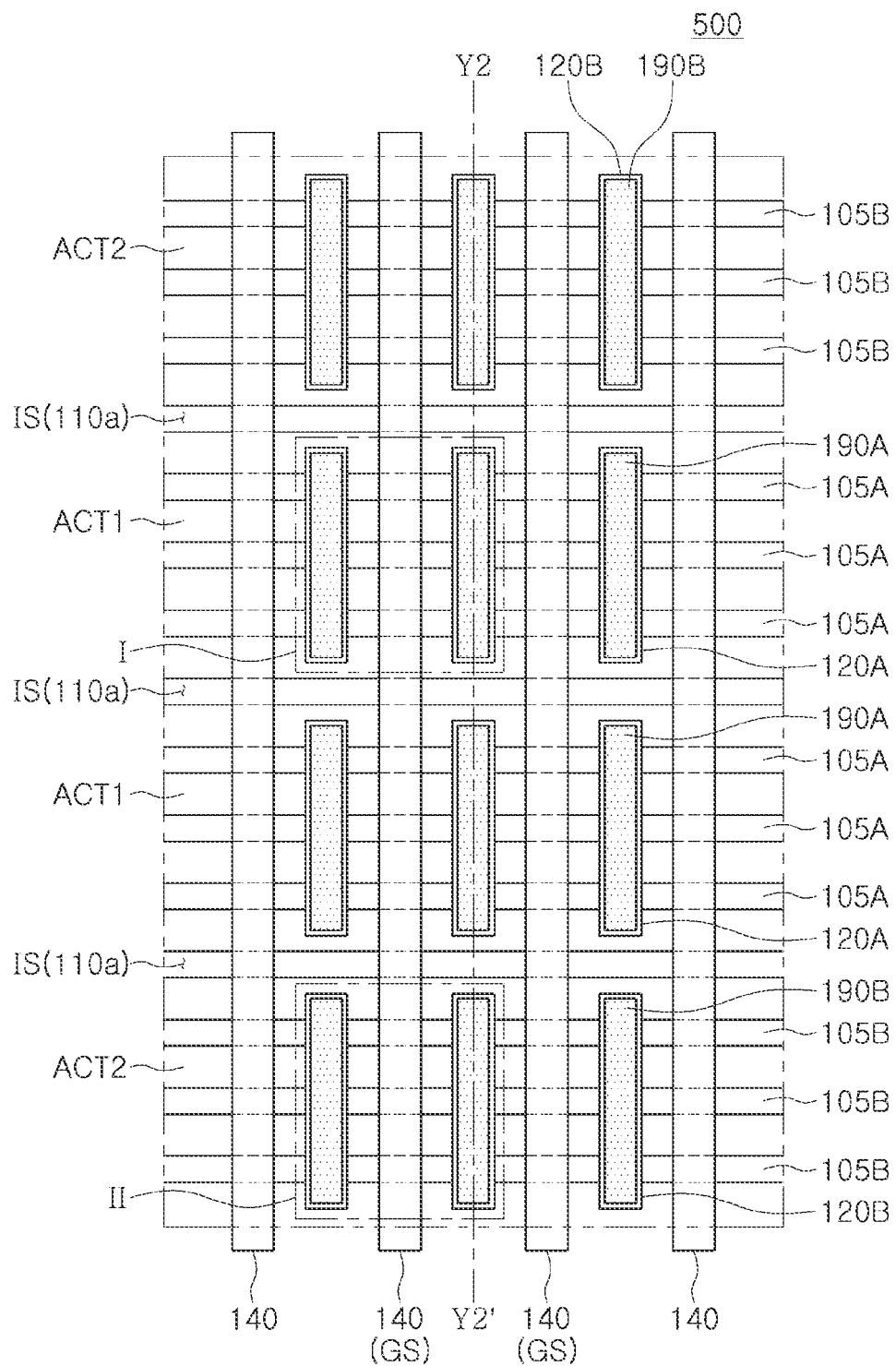
FIG. 3 is a plan view illustrating a semiconductor device according to an example embodiment.
Figure 4:
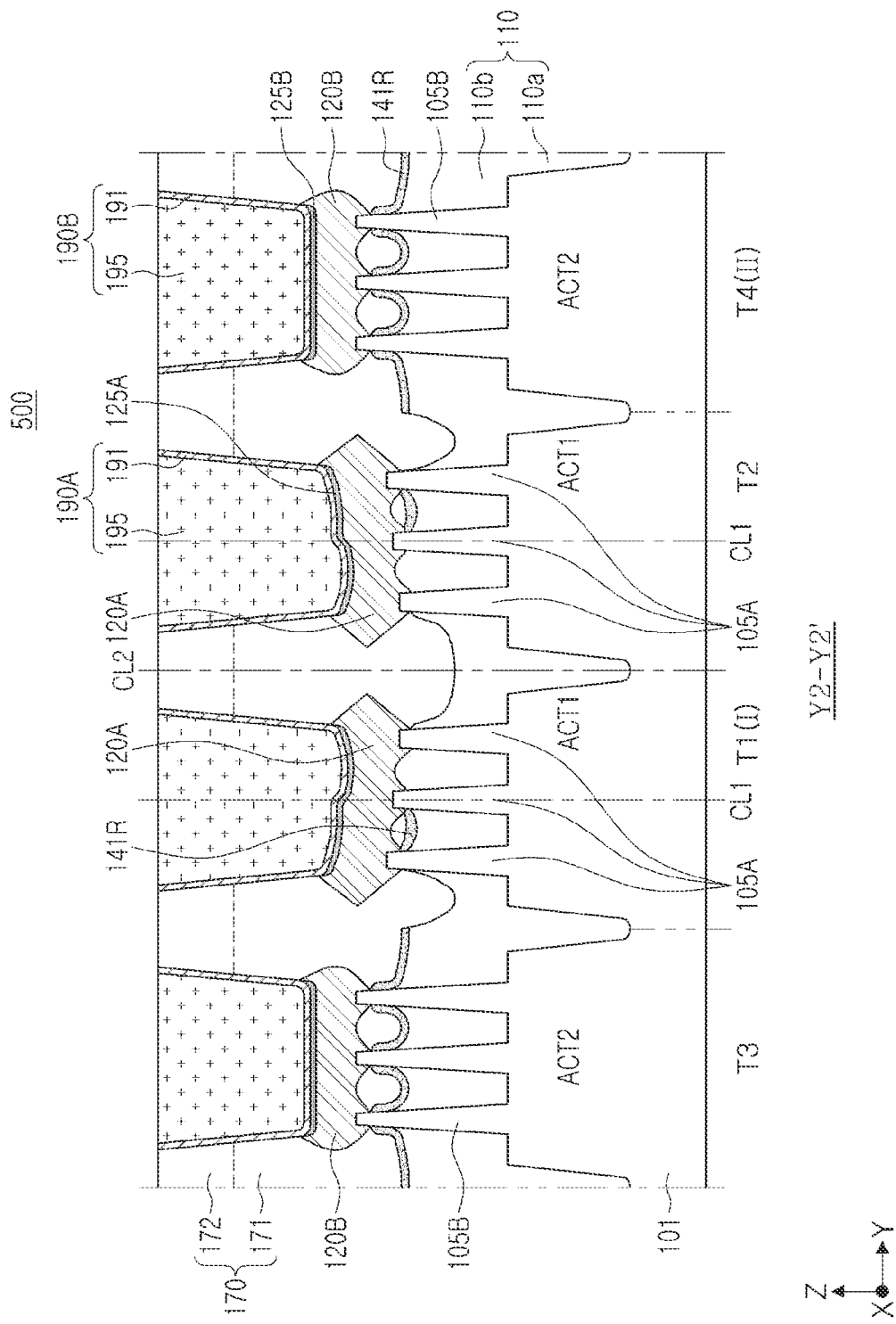
FIG. 4 is a cross-sectional view of the semiconductor device illustrated in FIG. 3, taken along line Y2-Y2'.

FIG. 3 is a plan view illustrating a semiconductor device according to an example embodiment, and FIG. 4 is a cross-sectional view of the semiconductor device illustrated in FIG. 3, taken along line Y2-Y2'.

Referring to FIGS. 3 and 4, a semiconductor device 500 according to an example embodiment may include first and second device regions T1 and T2 each having first active regions ACT1, and third and fourth device regions T3 and T4 each having second active regions ACT2. In this embodiment, the first and second device regions T1 and T2 may include P-type MOSFETs, and the third and fourth device regions T1 and T2 may include N-type MOSFETs.

Components of this embodiment will be understood with reference to descriptions of the same or similar components of other embodiments unless otherwise specified.

As illustrated in FIG. 3, the first and second active regions ACT1 and ACT2 may be separated from the adjacent active regions by an isolation structure IS (for example, the first isolation region 110a of the device isolation film 110). The first active regions ACT1 may be arranged adjacent to each other in the second direction (Y direction), and the second active regions ACT2 may be arranged on opposite sides of the group of first active regions ACT1 in the second direction (Y direction).

Two adjacent first active regions ACT1 each contain N-type impurities (e.g., phosphorus (P), nitrogen (N), arsenic (As), or antimony (Sb)), and second active regions ACT2 located on opposite sides of the group of two first active regions ACT1 may include P-type impurities (e.g., boron (B), indium (In), or gallium (Ga)). For example, the substrate 101 may be a P-type substrate, and the first active regions ACT1 may be formed as an N-type well.

The plurality of first active fins 105A are disposed on the first active regions ACT1 and may each extend in a first direction. Similarly, the plurality of second active fins 105B are disposed on the second active regions ACT2 and may each extend in the first direction. In this embodiment, the plurality of first active fins 105A and the plurality of second active fins 105B may both be arranged with a pitch of 40 nm or less in the second direction. In some embodiments, the pitch may be 30 nm or less.

In each of the device regions T1 to T4, first and second source/drain regions 120A and 120B may be formed over the plurality of first and second active fins 105A and 105B. The first source/drain region 120A may include silicon-germanium (SiGe), and may be doped with P-type impurities (e.g., boron (B), indium (In), or gallium (Ga)). A cross section (Y-Z cross section, see FIG. 4) of the first source/drain region 120A may have a pentagonal shape. The second source/drain region 120B includes silicon and may be doped with N-type impurities (e.g., phosphorus (P), nitrogen (N), arsenic (As), or antimony (Sb)). The cross-section (Y-Z cross-section) of the second source/drain region 120B may have a hexagonal shape or a polygonal shape having a gentle angle.

Referring to FIG. 4, in each of the first and second device regions T1 and T2, the plurality of first active fins 105A may include three active fins having different heights. In the case of the plurality of first active fins 105A, first active fins adjacent to each other (two adjacent first active fins located in the center of FIG. 4) between the first and second device regions T1 and T2 may have upper surfaces lower than upper surfaces of the remaining first active fins. In the first and second device regions T1 and T2, the first active fins adjacent to the third and fourth device regions T3 and T4 (or the second active regions ACT2), respectively, among the plurality of first active fins 105A, may have upper surfaces higher than those of the other first active fins. A description of the plurality of first active fins 105A in the respective first and second device regions T1 and T2 will be understood with reference to the active fins 105 of FIG. 2B.

The plurality of second active fins 105B positioned in each of the third and fourth device regions T3 and T4 may have upper surfaces having a higher level than that of the plurality of first active fins 105A. The plurality of second active fins 105B may include three active fins having relatively the same height. In this embodiment, the number of the first and second active fins 105A and 105B located in each of the first and second active regions ACT1 and ACT2 is illustrated as the same plural number, but in some or all of the active regions, a different number of active fins (e.g., one or a plurality) may be employed (see FIG. 9).

The insulating spacer 141R may be on a portion of the upper surface of the device isolation film 110. The insulating spacer 141R may be disposed around the first active fin adjacent to the third and fourth device regions T3 and T4, among the plurality of first active fins 110A. As in this embodiment, in the case of three active fins, as illustrated in FIG. 2B, the insulating spacer 141R is disposed in a region between two active fins close to the third and fourth device regions T3 and T4, but may not be disposed in a region between two active fins relatively far from the third and fourth device regions T3 and T4.

In a manner different therefrom, in the third and fourth device regions, relatively weaker recess etching (e.g., a difference between the etching time and/or the etchant type) is applied thereto, compared to the recess etching in the first and second device regions, and thus, the insulating spacer 141R may remain substantially over the upper surface of the device isolation film.

Similar to the example embodiment illustrated in FIG. 2B, the first source/drain regions 120A located in the first and second device regions T1 and T2 may each have a laterally asymmetrical structure, based on the center line CL1 of the source/drain region. In detail, the first source/drain regions 120A include two merged portions in which epitaxial portions regrown from adjacent active fins are combined, and a highest point of the bottom surface of the merged portion adjacent to the third and fourth device regions may be higher than a highest point of the bottom surface of the other merged portions.

In this embodiment, the first source/drain regions 120A located in the first and second device regions T1 and T2 may have a mirror symmetrical structure in a lateral direction, based on a device center line CL2 passing between the first and second device regions T1 and T2.

The semiconductor device 500 according to this embodiment may include first and second contact structures 190A and 190B in (e.g., penetrating) the interlayer insulating portion 170 and electrically connected to the first and second source/drain regions 120A and 120B, respectively. While the lower surface of the second contact structure 190B has a relatively flat surface, the lower surface of the first contact structure 190A may have a non-flat, curved surface similar to that of the contact structure 190 of the embodiment illustrated in FIG. 2B. Moreover, FIG. 4 illustrates first and second metal silicide layers 125A and 125B that may contact the lower surfaces of the first and second contact structures 190A and 190B, respectively.

FIGS. 5A to 5E are perspective views for respective major processes for describing a portion of a method of manufacturing a semiconductor device according to an example embodiment, and FIGS. 7A to 7E are perspective views for respective major processes to describe a subsequent portion of the method of manufacturing a semiconductor device according to the example embodiment. In this case, the perspective views are illustrated as processes of forming a P-type transistor and an N-type transistor indicated by "I" and "II" in FIG. 3, respectively.

FIGS. 5A to 5E are perspective views for respective processes/operations to describe a process of forming an active fin and source/drain in a method of manufacturing a semiconductor device according to an example embodiment.

Figure 5A:
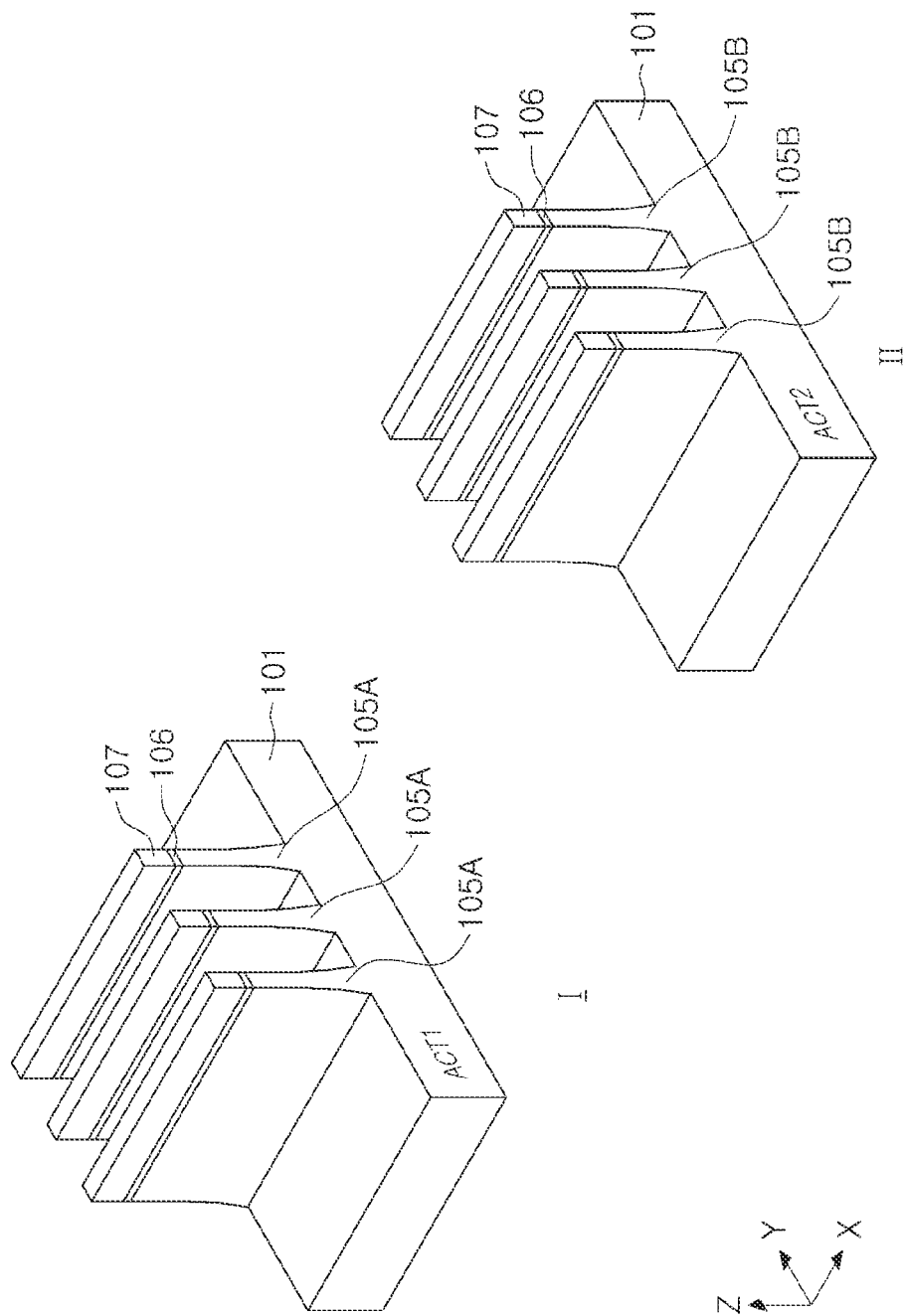
FIGS. 5A to 5E are perspective views for respective main processes to illustrate a part (source/drain formation) of a method of manufacturing a semiconductor device according to an example embodiment.

Referring to FIG. 5A, a plurality of first and second active fins 105A and 105B may be formed in first and second active regions ACT1 and ACT2, respectively.

The substrate 101 may include first and second active regions. In this embodiment, the first active region ACT1 may be an N-type impurity region, and the second active region ACT2 may be a P-type impurity region. The plurality of first and second active fins 105A and 105B may be formed using an anisotropic etching process using a pad oxide pattern 106 and a mask pattern 107. The plurality of first and second active fins 105A and 105B may each extend in a first direction (X direction) and may be arranged in a second direction (Y direction) substantially perpendicular to the first direction. For example, the pitch of the first and second active fins 105A and 105B may be 40 nm or less. In some embodiments, the pitch may be 30 nm or less. For example, the anisotropic etching process may use a double patterning technology (DPT) or a quadruple patterning technology (QPT).

Figure 5B:
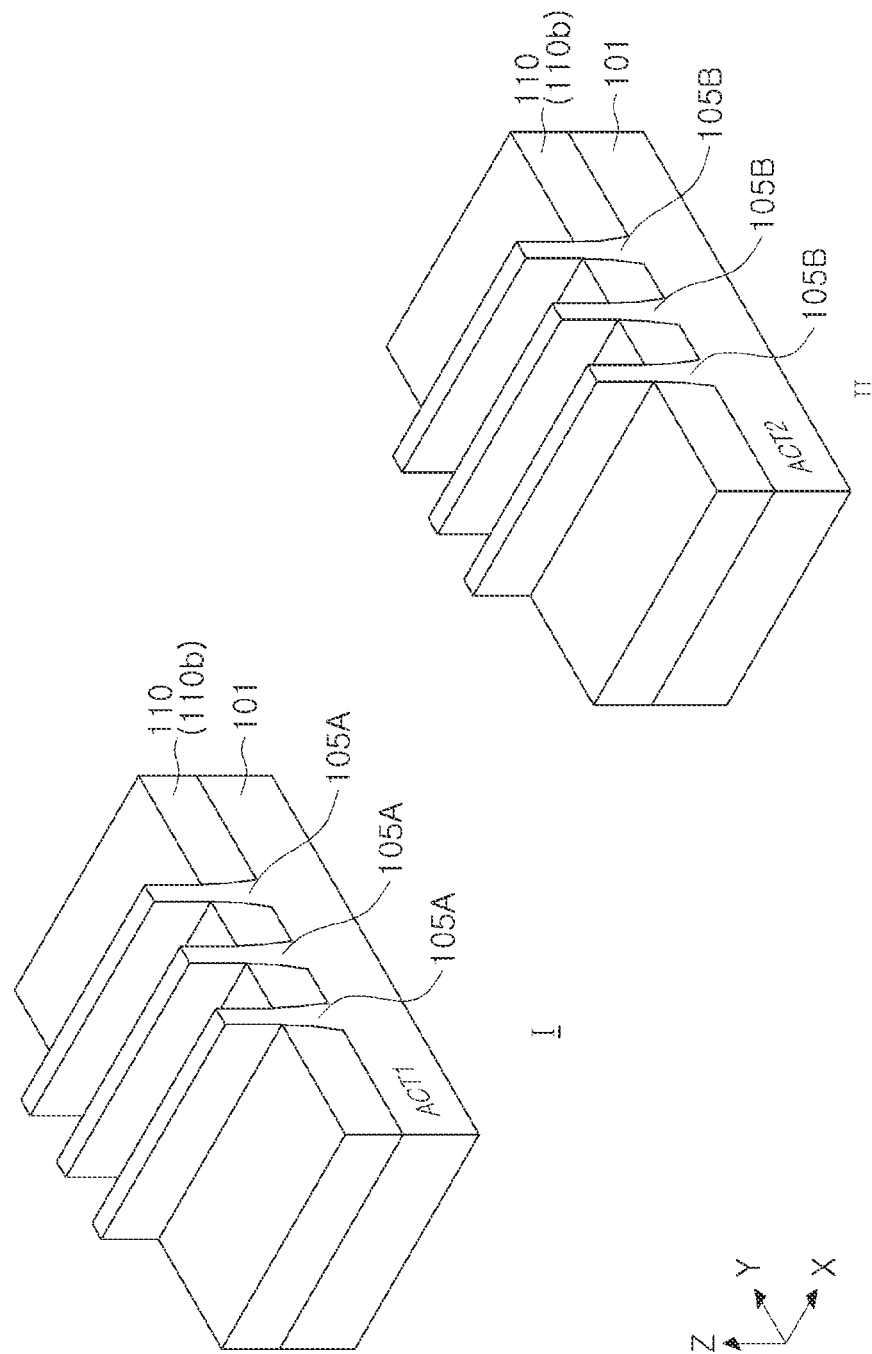

Subsequently, referring to FIG. 5B, a device isolation film 110 partially filling spaces between the plurality of first and second active fins 105A and 105B may be formed on the respective first and second active regions ACT1 and ACT2.

The device isolation film 110 may be formed by forming an insulating material on (e.g., to cover) the plurality of first and second active fins 105A and 105B and then by performing a process of planarizing the insulating material. During the planarization process, the pad oxide pattern 106 and the mask pattern 107 may be removed together. After the planarization process, the plurality of first and second active fins 105A and 105B may protrude upward beyond the device isolation film 110 (in detail, the second isolation region 110b) by etching back the insulating material in (e.g., filling) the spaces between the plurality of first and second active fins 105A and 105B. For example, the device isolation film 110 may be formed of EOS, USG, PSG, BSG, BPSG, FSG, SOG, TOSZ, or combinations thereof.

Figure 5C:
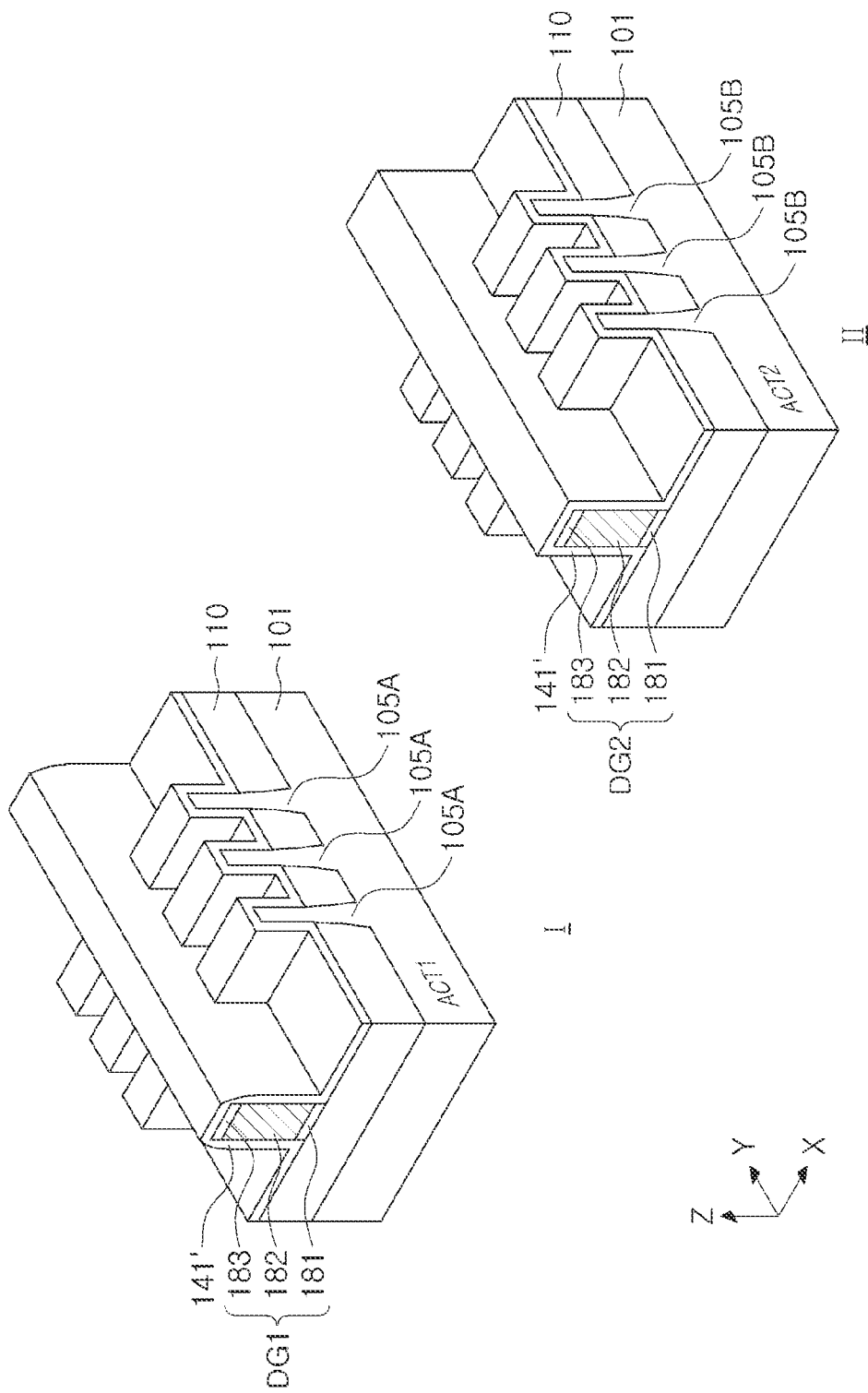

Next, referring to FIG. 5C, first and second dummy gate structures DG1 and DG2 and an insulating spacer film 141' for a gate spacer may be formed.

The first and second dummy gate structures DG1 and DG2 may extend in a second direction (Y direction) to intersect (e.g., to cross over) the first and second active fins 105A and 105B, respectively. The first and second dummy gate structures DG1 and DG2 may each include a dummy gate insulating layer 181, a dummy gate electrode 182, and a mask pattern layer 183. The dummy gate insulating layer 181 and the dummy electrode 182 may be formed by an etching process using the mask pattern layer 183. The dummy gate insulating layer 181 may be formed of silicon oxide, and the dummy gate electrode 182 may be formed of polysilicon. For example, the insulating spacer film 141' may include silicon nitride ($SiN_x$), silicon oxynitride ($SiO_xN_y$), silicon carbonitride ($SiC_xN_y$), silicon oxycarbonitride ($SiO_xC_yN_z$), or combinations thereof.

Figure 5D:
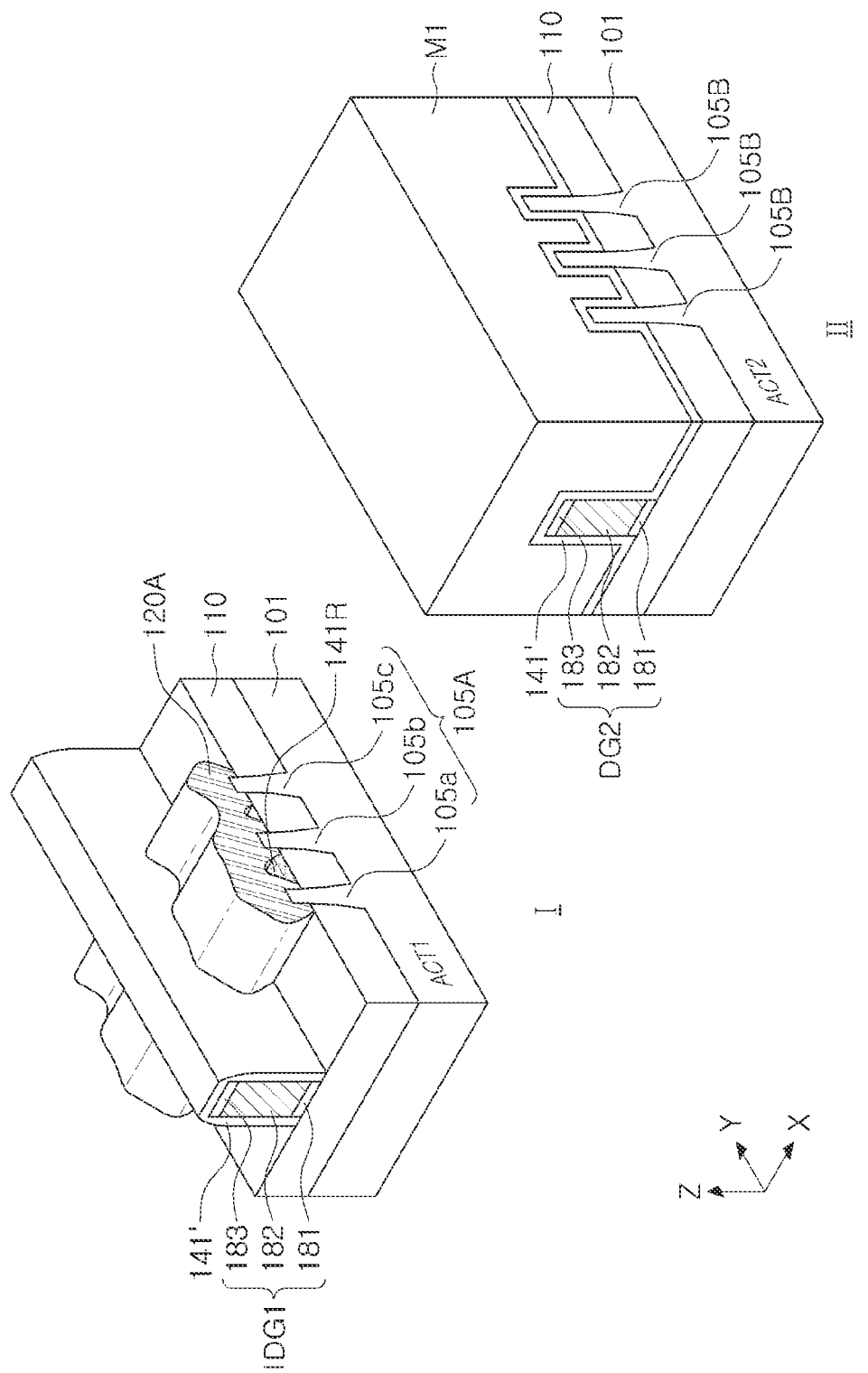

Next, referring to FIG. 5D, after etching such that the plurality of first active fins 105A located in the first active region ACT1 are recessed, a first source/drain region 120A is formed on the recessed upper surfaces of the plurality of active fins 105A.

The first source/drain region forming process may be performed in a state in which the second active region ACT2 is covered with a first mask M1 such that the first active region ACT1 is exposed. The recessed upper surfaces of the plurality of active fins 105A may be slightly higher than the upper surface of the device isolation film 110. The first source/drain region 120A may be formed from the recessed upper surface, using selective epitaxial growth (SEG).

The process illustrated in FIG. 5D may be described in detail with reference to FIGS. 6A to 6D. FIGS. 6A to 6D may also be understood as cross-sections corresponding to FIG. 4.

Figure 6A:
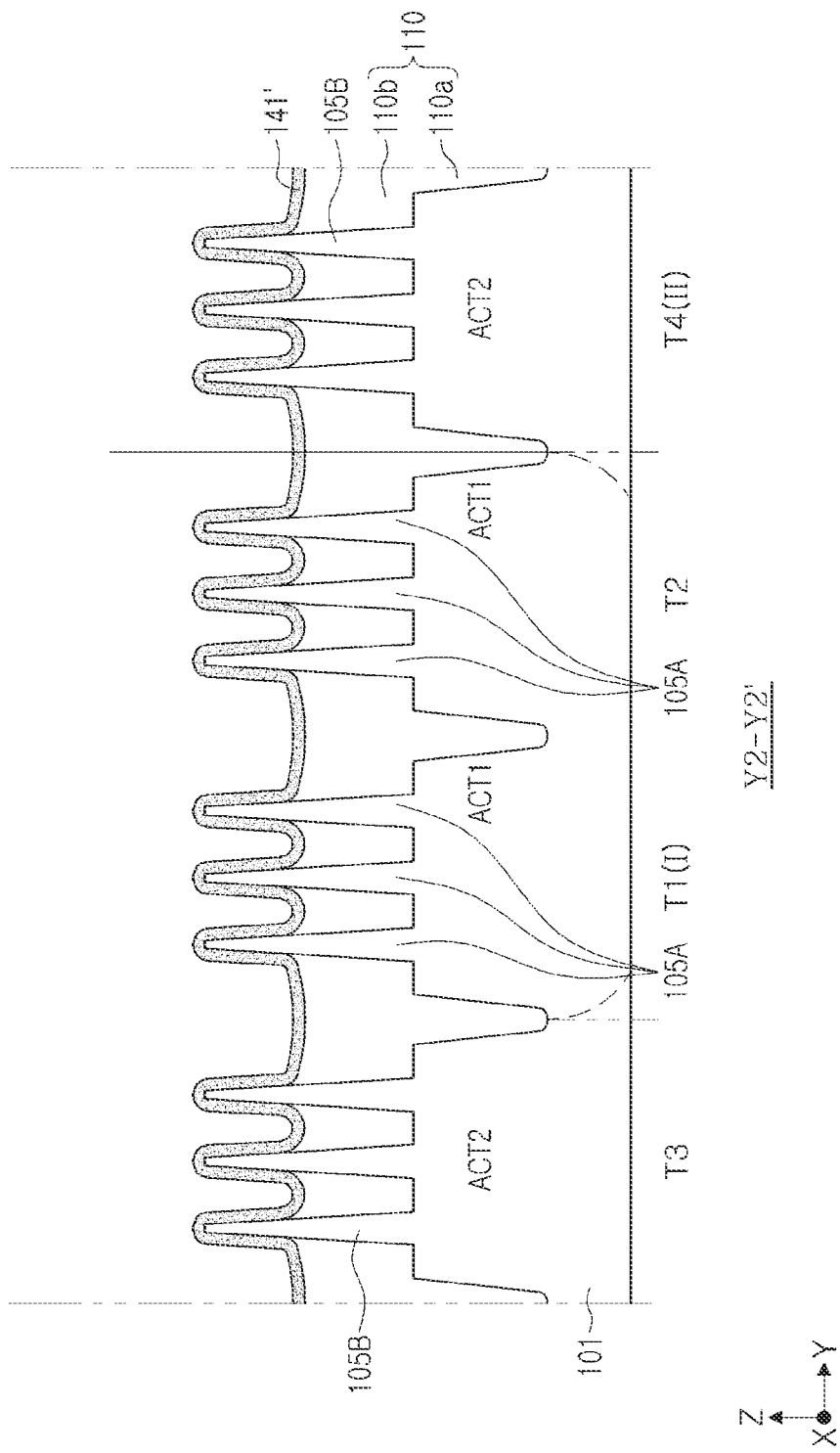

First, FIG. 6A illustrates the operation corresponding to FIG. 5C. The insulating spacer film 141' for a gate spacer may be formed on the device isolation film 110, over the first and second active regions ACT1 and ACT2.

Next, referring to FIG. 6B, a recess etching process may be performed after the first mask M1 is formed.

As described above, the second active region ACT2 is covered by the first mask M1, and the first active region ACT1 is exposed. In the recess etching process, the etchant injected into the exposed area may exhibit different flow properties locally. For example, as indicated by the arrows in FIG. 6B, a portion of the etchant is moved at a relatively high flow rate along the sidewall of the first mask M1, and may form a deep valley in a region of the device isolation film 110 adjacent to the first mask M1. Since the continuously injected etchant flows along the deep valley and the direction of the flow thereof is upward, it has a relatively small effect on the first active fins 105a adjacent to the second active region ACT2, and on the insulating spacer film 141' adjacent thereto. For example, the first active fins 105a adjacent to the second active regions ACT2 may be etched less than the first active fins 105c adjacent to the space between the first active regions ACT1.

Figure 5E:
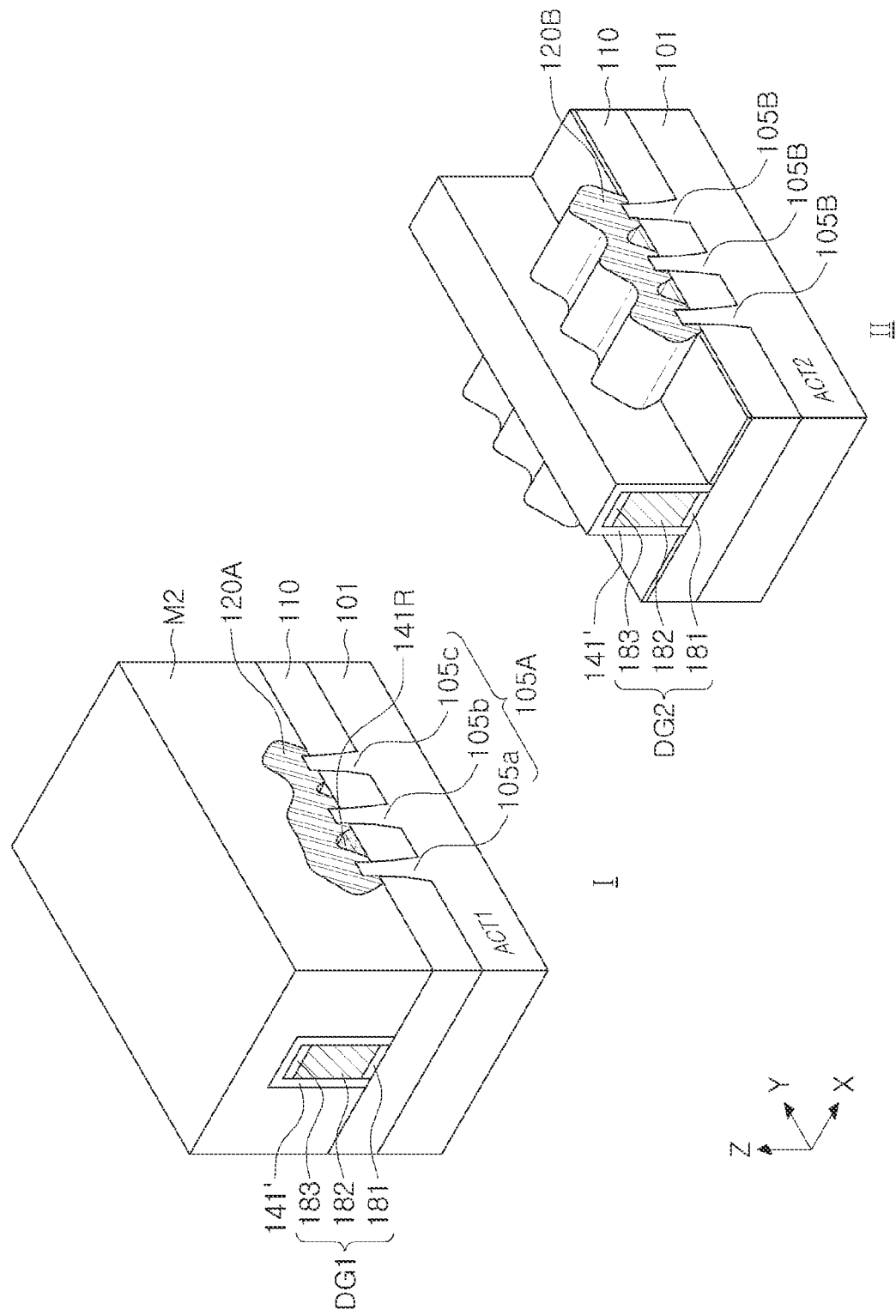

As a result, in each of the first active regions ACT1, an upper surface of the first active fin 105a adjacent to the second active region ACT2 has a highest level, and the first active fin 105c located on the side opposite thereto may have a lowest level. An upper surface level of the first active fin 105b positioned in the middle may be lower than the upper surface of the first active fin 105a and higher than the upper surface of the first active fin 105c. In this manner, the recessed upper surfaces of the first active fins 105a, 105b and 105c may have different heights. In addition, the insulating spacer 141R may remain on a region adjacent to the first active fin 105a, on the upper surface of the device isolation film 110. As illustrated in FIGS. 5E and 6B, the insulating spacer 141R may remain in a region between two active fins 105a and 105b adjacent to the second active regions ACT2.

Figure 6C:
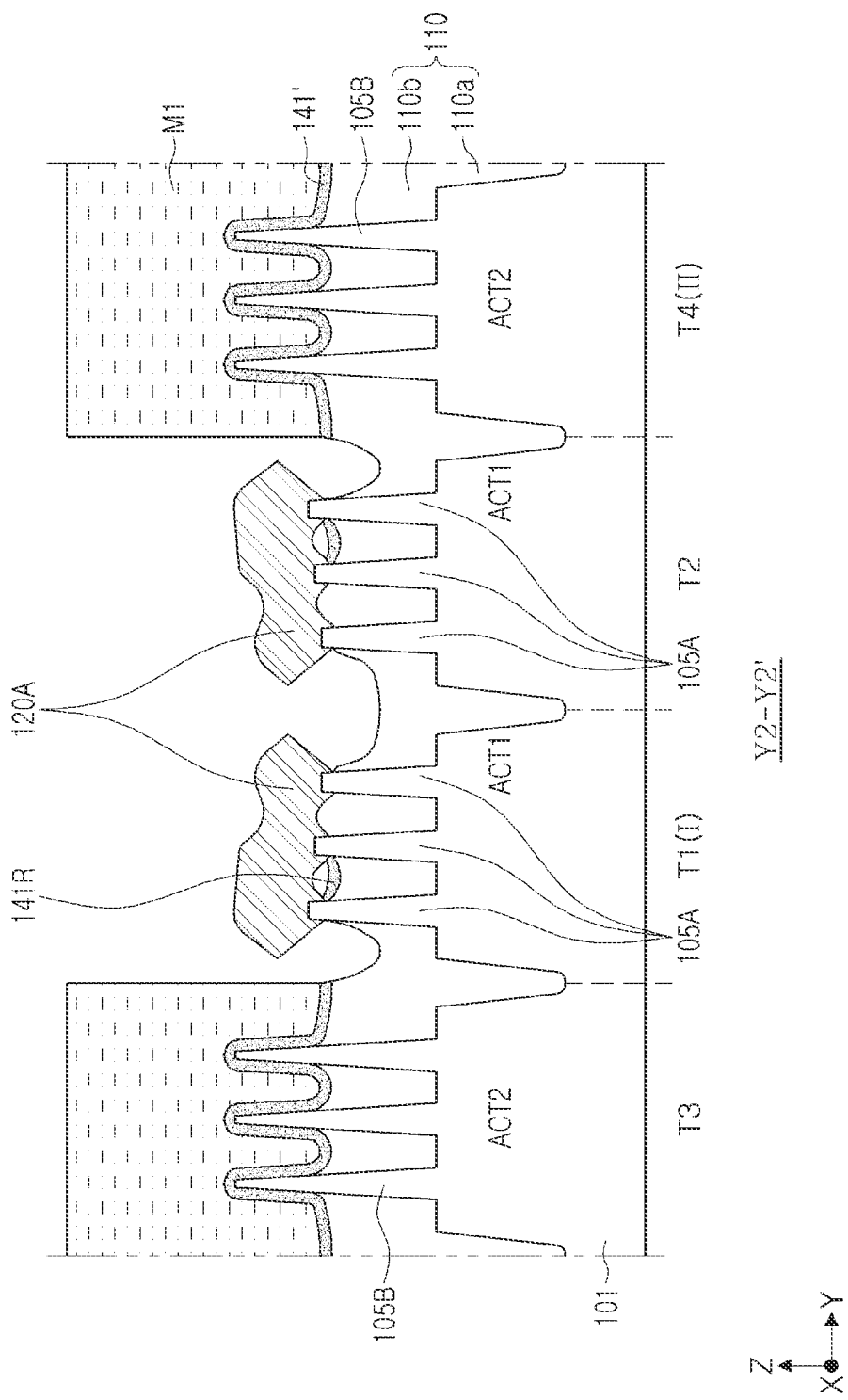

Subsequently, referring to FIG. 6C, the first source/drain region 120A may be formed on the recessed upper surfaces of the first active fins 105A by selective epitaxial growth. The first source/drain region 120A may include a silicon-germanium (SiGe) epitaxial layer. Referring to FIG. 6C, the Y-Z cross section of the first source/drain region 120A may have a substantially pentagonal shape. In some embodiments, the silicon-germanium (SiGe) epitaxial layer may improve electrical characteristics by generating compressive stress in the first active fins 105A of silicon (Si). In this embodiment, the first source/drain region 120A may be doped with the P-type impurity in-situ or by a separate ion implantation process. For example, the P-type impurity may be boron (B), indium (In) and/or gallium (Ga).

As described above, the epitaxial portions are regrown on the upper surfaces of the first active fins 105a, 105b and 105c having different heights, to be merged with each other. Since a relatively wide crystal surface is provided between the first active fins 105a and 105b adjacent to the second active regions ACT2, regrowth is actively performed such that the epitaxial portions merge to have an almost flat upper surface, whereas the epitaxial portion between the first active fins 105b and 105c on the opposite side is not completely merged, to have a relatively curved upper surface. In addition, in the first source/drain regions 120A, a highest point of the bottom surface of the merged portion between the first active fins 105a and 105b may be higher than a highest point of the bottom surface of the merged portion between the first active fins 105b and 105c. As such, the first source/drain regions 120A may have a laterally asymmetrical structure.

Figure 6D:
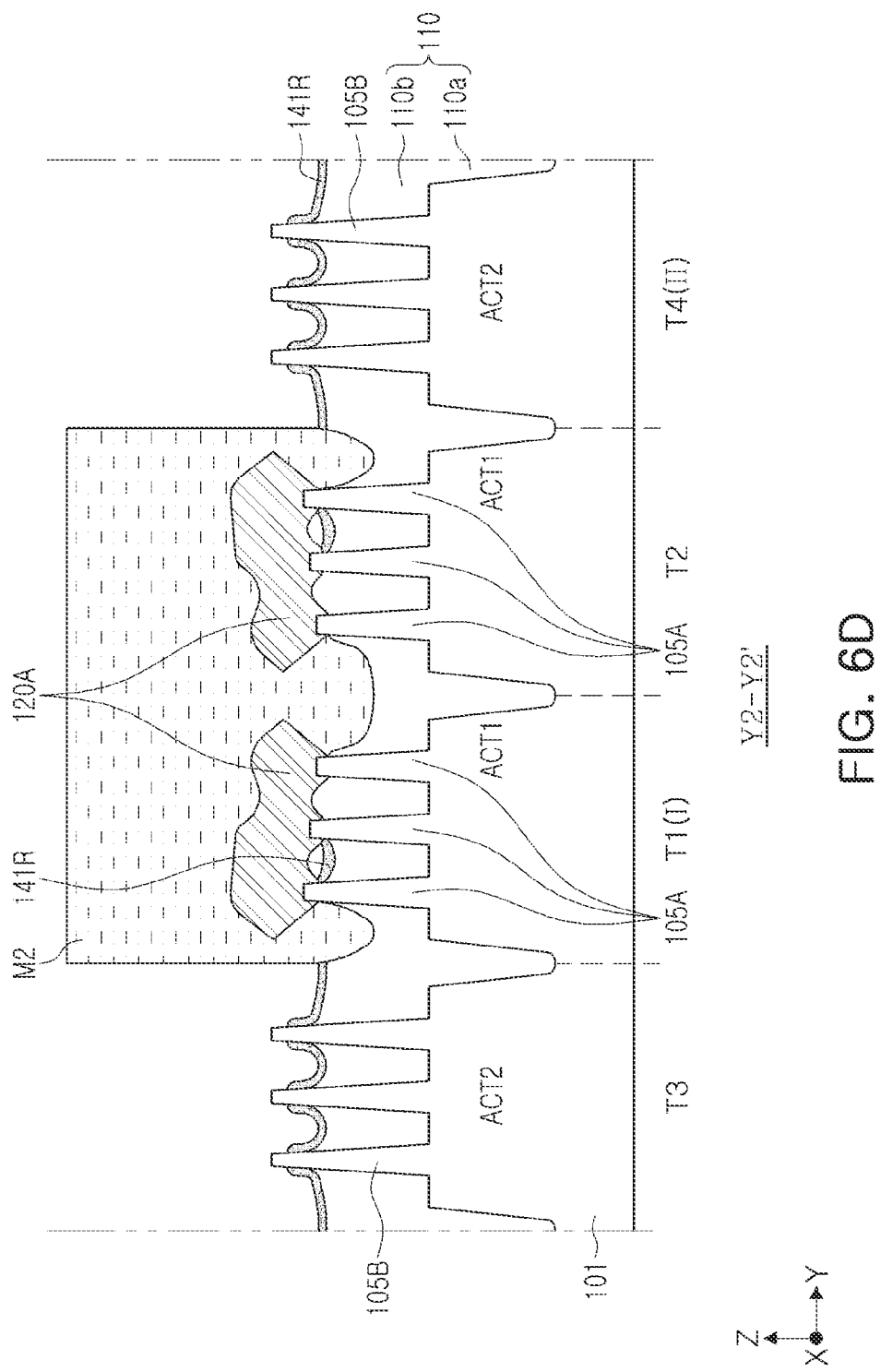

Next, referring to FIG. 6D, the first mask M1 may be removed, and a second mask M2 may be formed in such a manner that the second active region ACT2 is exposed and the first active region ACT1 is covered. Subsequently, as illustrated in FIG. 5E, second source/drain regions 120B may be formed on the plurality of second active fins 105B located in the second active region ACT2, while the second mask M2 covers the first active region ACT1.

This series of processes may be performed similarly to the processes described in FIG. 5D above. In detail, after etching such that the upper surfaces of the plurality of second active fins 105B are recessed, the second source/drain regions 120B may be formed on the recessed upper surfaces by using selective epitaxial growth (SEG). Since the recess etching of the second active fins 105B in the N-type transistor region (II) is performed shorter than that in the P-type transistor region (I), the asymmetry described above may weakly or rarely occur. For example, the recessed upper surfaces of the second active fins 105B may have substantially the same level, and may have a relatively higher level than the upper surfaces of the first active fins 105A. In addition, the insulating spacer 141R may remain in almost the entire area of the upper surface of the device isolation film 110, except for the recessed upper surfaces of the second active fins 105B.

The second source/drain regions 120B may include a silicon (Si) epitaxial layer. The second source/drain regions 120B may have a smooth hexagonal shape in a Y-Z cross section. The second source/drain regions 120B may be doped with N-type impurities, in a manner similar to the doping manner of the first sources/drains 120A. For example, the N-type impurity may be phosphorus (P), nitrogen (N), arsenic (As), and/or antimony (Sb).

FIGS. 7A to 7E are perspective views for respective processes/operations to describe the formation of the gate structure GS and the contact structures 190A and 190B in a method of manufacturing a semiconductor device according to an example embodiment.

Figure 7A:
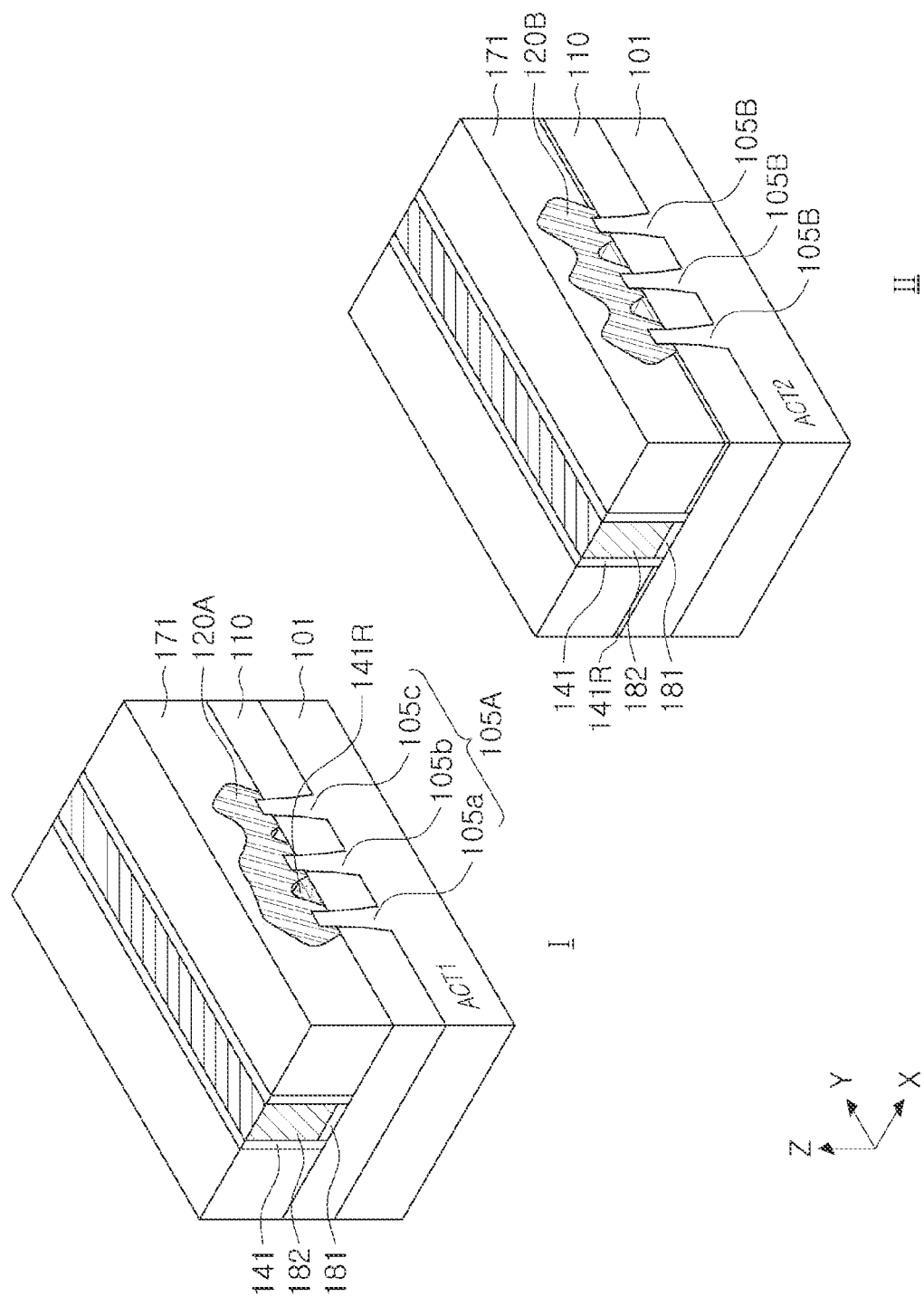
FIGS. 7A to 7E are perspective views according to major processes to illustrate another part (formation of a gate structure and a contact structure) of a method of manufacturing a semiconductor device according to an example embodiment.

First, referring to FIG. 7A, an inter-gate insulating layer 171 may be formed over the P-type transistor region I and the N-type transistor region II.

The inter-gate insulating layer 171 is formed of an insulating material to cover the first and second dummy gate structures DG1 and DG2 (FIG. 5E) and the first and second source/drain regions 120A and 120B (FIG. 5E), and then, the inter-gate insulating layer 171 and the first and second dummy gate structures DG1 and DG2 may be planarized to expose the upper surface of the dummy gate electrode 182. For example, the inter-gate insulating layer 171 may include at least one of silicon oxide, silicon nitride, and silicon oxynitride.

Figure 7B:
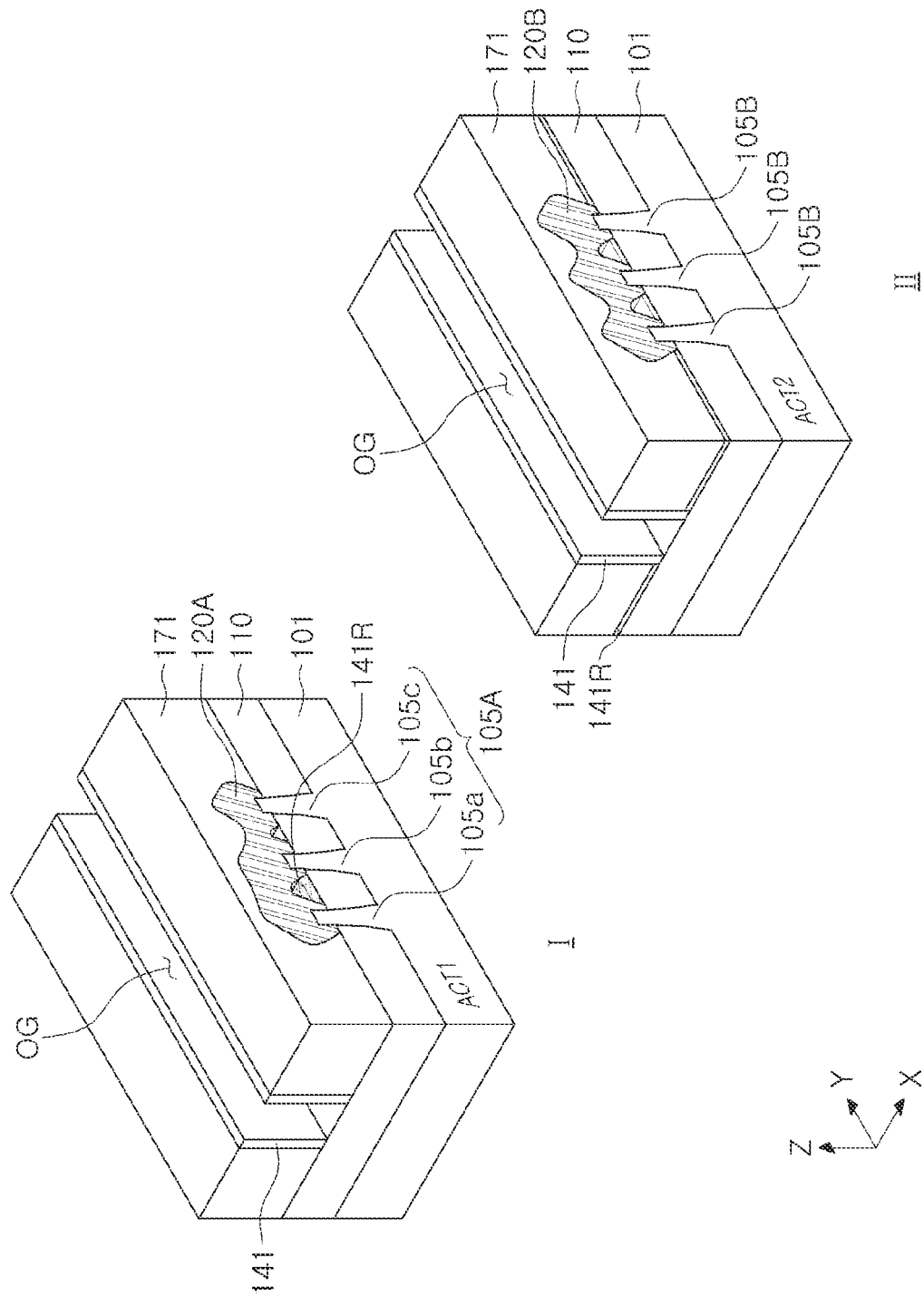

Next, referring to FIG. 7B, the dummy gate electrode 182 and the dummy gate insulating layer 181 may be removed to form a gate opening OG.

The gate opening OG may be provided as a space in which a gate structure is to be formed. The gate opening OG may be defined by an interval between the gate spacers 141 in the first direction. The first and second active fins 105A and 105B that are not recessed may remain in the gate opening OG.

Figure 7C:
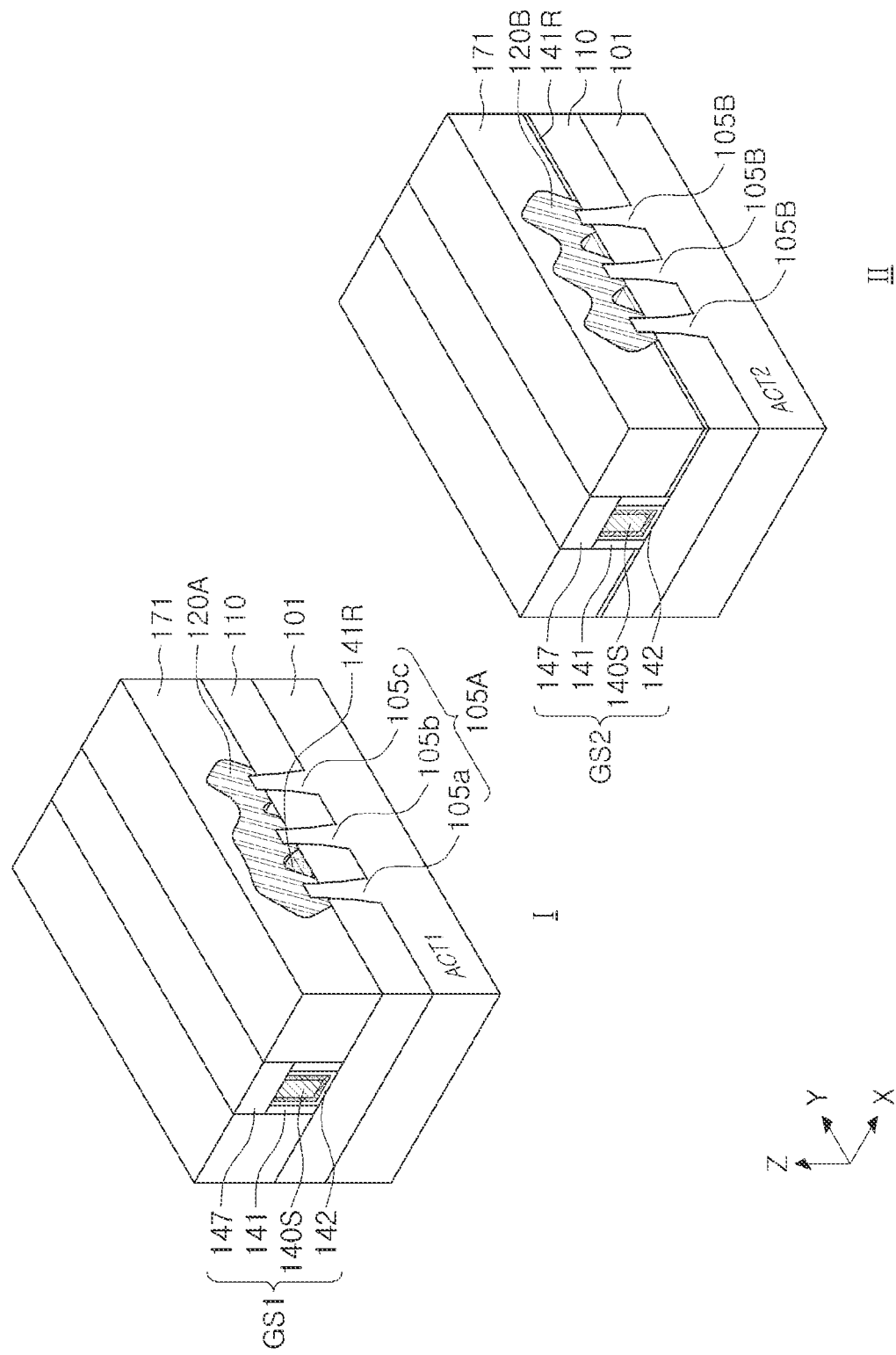

Next, referring to FIG. 7C, first and second gate structures GS1 and GS2 may be formed in the gate openings OG. In this embodiment, the first and second gate structures GS1 and GS2 have the same structure and may be formed simultaneously. In another embodiment, at least some layers of the first and second gate structures GS1 and GS2 may be formed of different materials by different processes.

The first and second gate structures GS1 and GS2 may include a gate insulating layer 142 and a gate electrode 145. The gate insulating layer 142 may be formed substantially conformally along the inner side and bottom surfaces of the gate opening OG. For example, the gate insulating layer 142 may include oxide, nitride, or a high-k material, and may have a multilayer structure. The gate insulating layer 142 of the first gate structure GS1 may include a material different from the gate insulating layer 142 of the second gate structure GS2 or may have a different multilayer structure.

The gate electrode 145 may be formed on the gate insulating layer 142 in (e.g., to fill) the remaining space of the gate opening OG. The gate electrode 145 may include doped polysilicon, metal, conductive metal nitride, conductive metal carbide, or combinations thereof. For example, the gate electrode 145 may be formed of Al, Cu, Ti, Ta, W, Mo, TaN, NiSi, CoSi, TiN, WN, TiAl, TiAlN, TaCN, TaC, TaSiN, or combinations thereof. The gate electrode 145 of the first gate structure GS1 may include a different material or a different multilayer structure from the gate electrode 145 of the second gate structure GS2. In some embodiments, the gate electrode 145 may include a work function metal-containing layer and a gap fill metal layer. The work function metal-containing layer may include at least one metal selected from Ti, W, ruthenium (Ru), niobium (Nb), Mo, Hf, Ni, Co, Pt, ytterbium (Yb), terbium (Tb), dysprosium (Dy), erbium (Er), and palladium (Pd). The gap-fill metal layer may be formed of a W film or an Al film. In some embodiments, the gate electrode 145 may include a stacked structure of TiAlC/TiN/W, a stacked structure of TiN/TaN/TiAlC/TiN/W, or a stacked structure of TiN/TaN/TiN/TiAlC/TiN/W, but the configuration is not limited thereto. After the gate insulating layer 142 and the gate electrode 145 are etched back to a predetermined depth, the gate capping layer 147 may be formed in the etched-back space. The gate capping layer 147 may be planarized to have an upper surface that is substantially coplanar with the upper surface of the inter-gate insulating layer 171.

Figure 7D:
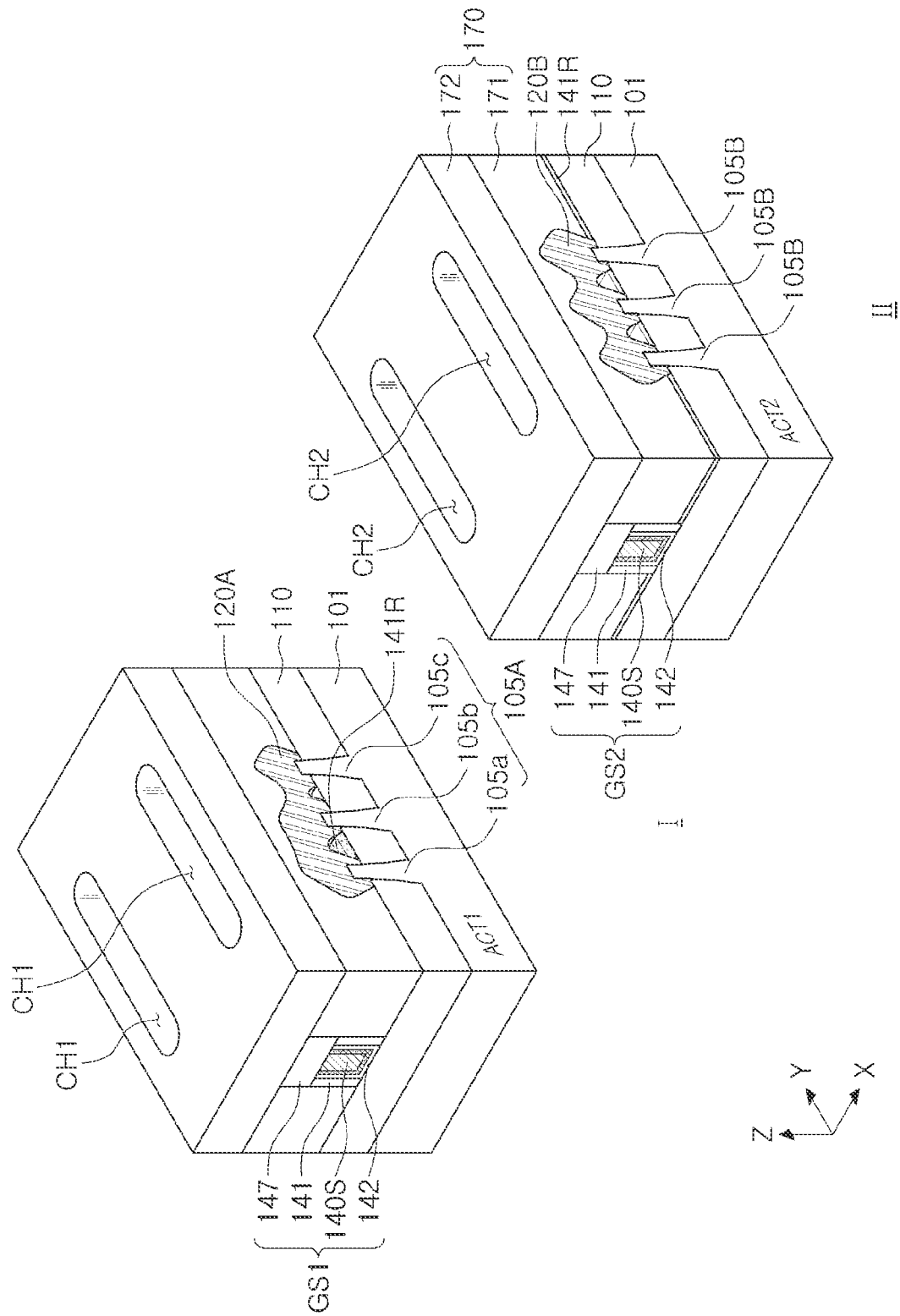

Subsequently, referring to FIG. 7D, first and second contact holes CH1 and CH2 penetrating an interlayer insulating portion 170 may be formed.

First, a capping insulating layer 172 is formed on an inter-gate insulating layer 171 to form the interlayer insulating portion 170. The first and second contact holes CH1 and CH2 may be formed to be connected to the first and second source/drain regions 120A and 120B, respectively. In the process of forming the first and second contact holes CH1 and CH2, some regions of the first and second source/drain regions 120A and 120B may be recessed. After the first and second contact holes CH1 and CH2 are formed, a process of forming a metal silicide (125 in FIG. 4) may be performed to reduce the contact resistance.

Figure 7E:
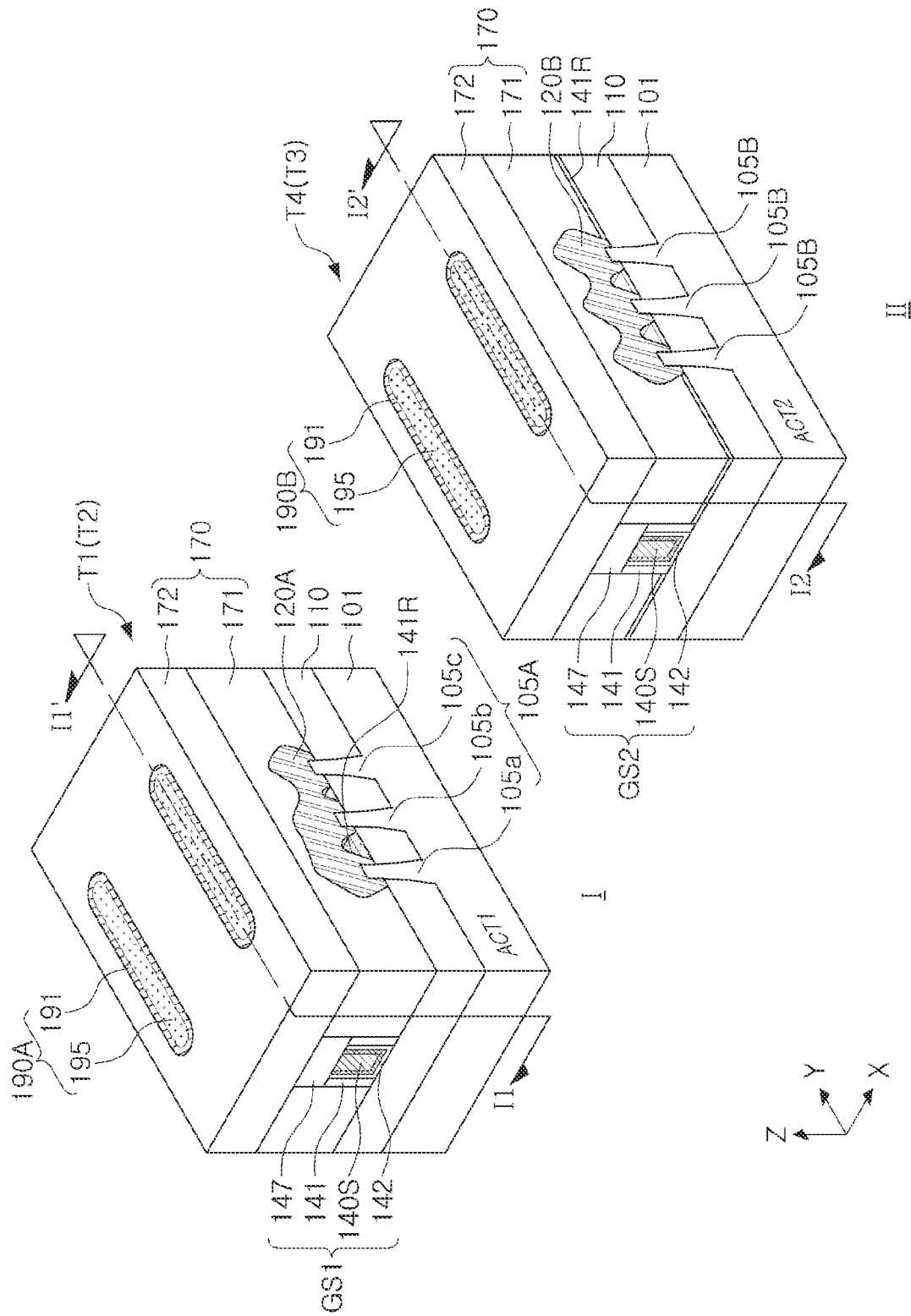

Next, referring to FIG. 7E, first and second contact structures 190A and 190B may be formed in the first and second contact holes CH1 and CH2, respectively. The first and second contact structures 190A and 190B may have similar structures and may be formed together in the same process.

The first and second contact structures 190A and 190B may include a conductive barrier 191 that impedes/prevents diffusion of a material of a contact plug 195. The conductive barrier 191 may be conformally formed using an atomic layer deposition (ALD) or CVD process. For example, the conductive barrier 191 may include TiN, TaN, AlN, WN, and combinations thereof. In addition, the contact plug 195 may include tungsten (W), cobalt (Co), titanium (Ti), alloys thereof, or combinations thereof.

Figure 8:
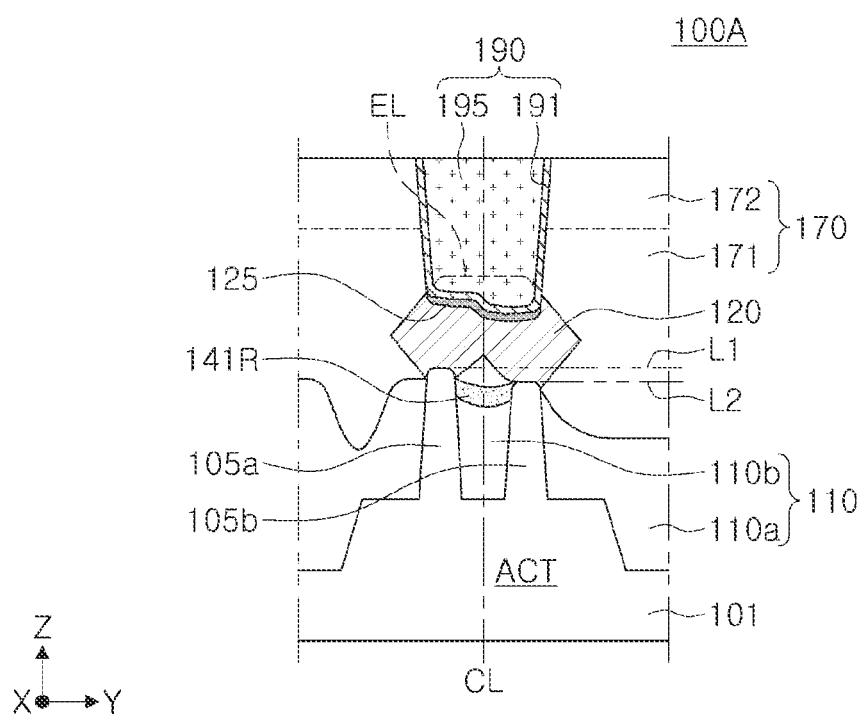
FIG. 8 is a cross-sectional view illustrating a semiconductor device according to an example embodiment (two active fins)

FIG. 8 is a cross-sectional view illustrating a semiconductor device according to an example embodiment (two active fins).

In a semiconductor device 100A illustrated in FIG. 8, except that two active fins are disposed in a single active region, and thus, asymmetry of the source/drain regions 120 is slightly changed, it will be understood that the semiconductor device 100A is similar to the semiconductor device 100 illustrated in FIG. 1 and FIG. 2A and FIG. 2B. In addition, the components of this embodiment will be understood with reference to the description of the same or similar components of the embodiment illustrated in FIGS. 1, 2A and 2B (in detail, FIG. 2B) unless otherwise specifically described.

First and second active fins 105a and 105b extend in the first direction (X direction) in the active region ACT and may be arranged in a second direction (Y direction) intersecting the first direction. Recessed upper surfaces of the first and second active fins 105a and 105b may have different levels. An upper surface level L1 of the first active fin 105a located on one side may be higher than an upper surface level L2 of the second active fin 105b located on the other side.

An insulating spacer 141R may be on a portion of the upper surface of the device isolation film 110. The insulating spacers 141R may be arranged asymmetrically laterally with respect to the center line CL of the source/drain region 120. In this embodiment, the center line CL of the source/drain region may be a vertical line extending through the center between the first and second active fins 105a and 105b.

The insulating spacer 141R is disposed on an area adjacent to the first active fin 105a, on the upper surface of the device isolation film 110, and may not be disposed on at least an outer region of the second active fin 105b, on the upper surface of the device isolation film 110. As illustrated in FIG. 8, the insulating spacer 141R is disposed on an outer region of the first active fin 105a and a region between the first and second active fins 105a and 105b, on the upper surface of the device isolation film 110, but may not be disposed on an outer region of the second active fin 105b, on the upper surface of the device isolation film 110.

Referring to the cross section of FIG. 8, the source/drain region 120 according to this embodiment may have a laterally asymmetrical structure with respect to the center line CL of the source/drain region 120.

When dividing the source/drain region 120 into a first region adjacent to the first active fin 105a and a second region adjacent to the second active fin 105b, based on a center line CL of the source/drain region, the area of the second region may be larger than the area of the first region. Referring to FIG. 8, a dotted line EL represents an upper surface line of an epitaxial layer for the source/drain region 120 before forming the contact structure 190. The contact structure 190 may have a lower surface of which a portion adjacent to the second active fin 105b is lower than a portion adjacent to the first active fin 105a.

In this manner, not only the upper surface levels of the first and second active fins 105a and 105b are different, but also the insulating spacer 141R is asymmetrically distributed, based on the center line CL of the source/drain region 120, and thus, the source/drain regions 120 may also have an asymmetrical structure.

Figure 9:
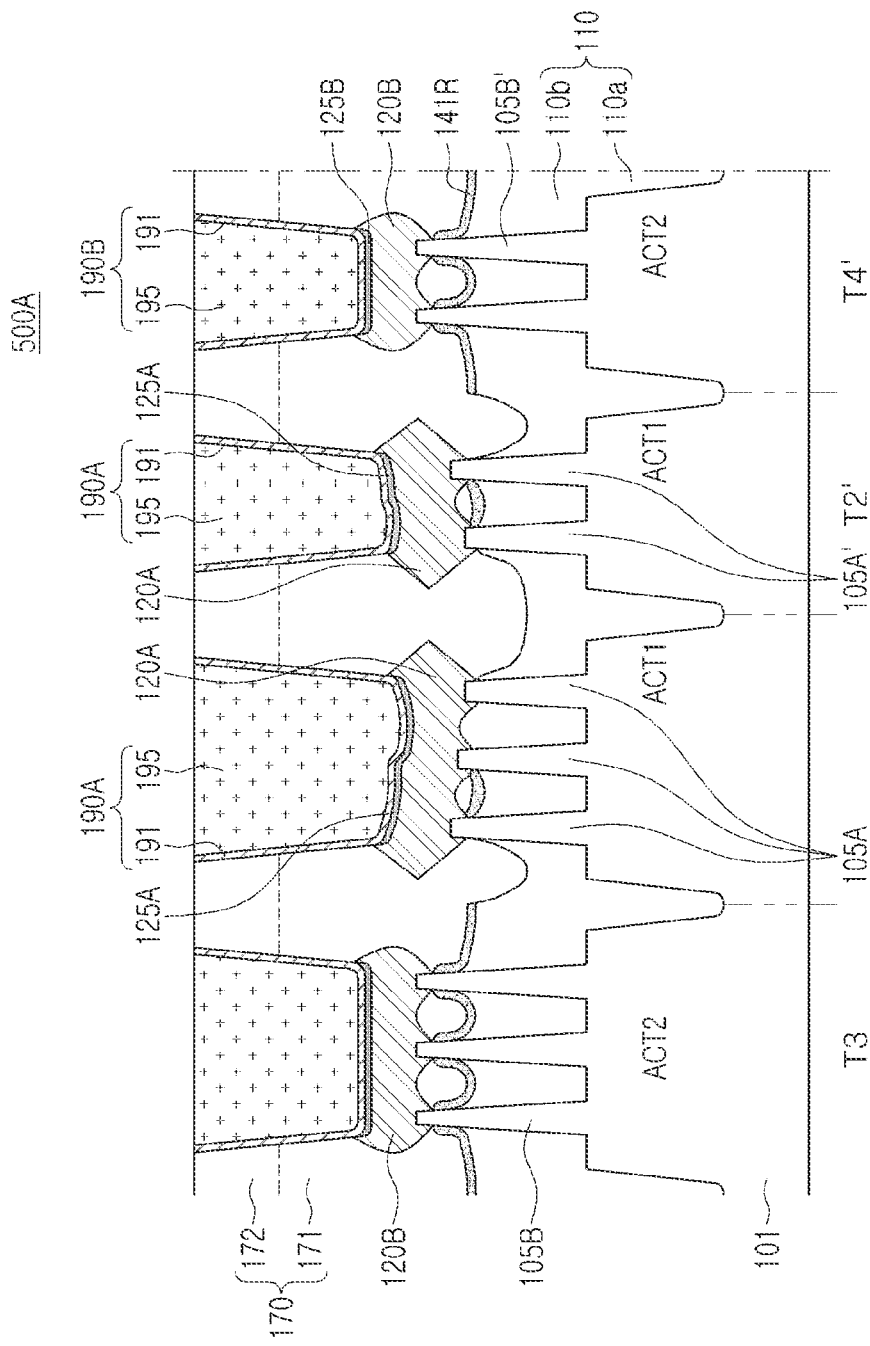
FIG. 9 is a cross-sectional view illustrating a semiconductor device according to an example embodiment.

FIG. 9 is a cross-sectional view illustrating a semiconductor device according to an example embodiment.

In the case of a semiconductor device 500A illustrated in FIG. 9, except that a different number (two) of active fins 105A' and 1053 are disposed in some transistor regions T2' and T4', the semiconductor device 500A will be understood to be similar to the semiconductor device 500 illustrated in FIGS. 3 and 4. In addition, components of this embodiment will be understood with reference to descriptions of the same or similar components of the embodiment illustrated in FIGS. 3 and 4 (in detail, FIG. 4) unless otherwise specified.

As previously described, in this embodiment, a different number of first and second active fins 105A and 105B may be disposed in some of the first and second active regions ACT1 and ACT2. In this embodiment, three active fins 105A and 105B are disposed in the first transistor region T1 and the third transistor region T3, respectively, similar to the embodiment illustrated in FIG. 4, and two active fins 105A' and 1053 may be disposed in the second transistor region T2' and the fourth transistor region T4', respectively. The first and second transistor regions may have asymmetry, and in detail, the second transistor region T2' may have asymmetry similar to the embodiment described in FIG. 8.

Figure 10:
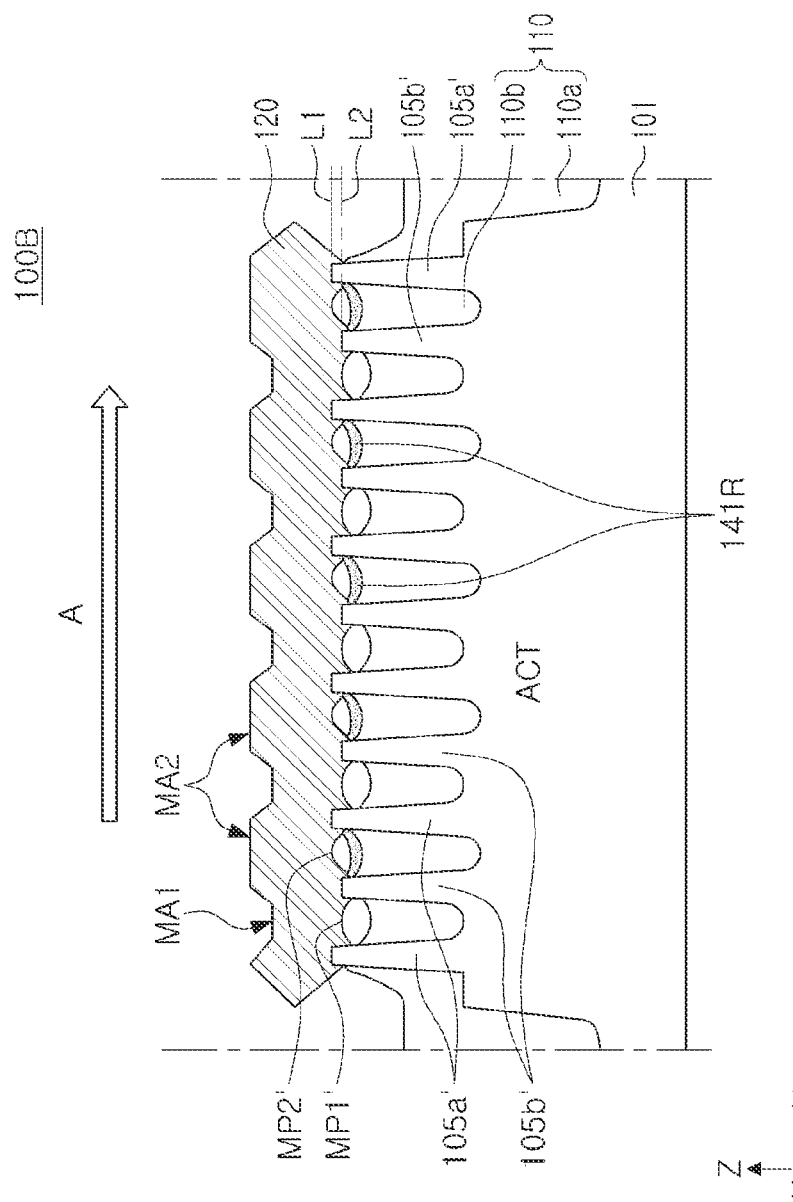
FIG. 10 is a cross-sectional view illustrating a semiconductor device according to an example embodiment.

FIG. 10 is a cross-sectional view illustrating a semiconductor device according to an example embodiment.

Referring to FIG. 10, a semiconductor device 100B includes an active region ACT disposed on a substrate 101, a plurality of first and second active fins 105a' and 105b' each extending in a first direction (X direction), on the active region ACT, a device isolation film 110 disposed on the substrate 101, and a source/drain region 120 disposed over the first and second active fins 105a' and 105b'.

The plurality of first and second active fins 105a' and 105b' may be alternately arranged in a second direction (Y direction) intersecting the first direction. Also, an upper surface level L2 of the plurality of second active fins 105b' may be lower than an upper surface level L1 of the first active fins 105a' adjacent thereto. As illustrated in FIG. 10, the first and second active fins 105a' and 105b' may be repeated in a high-low-high-low manner in direction A.

The source/drain region 120 may include a plurality of merged portions MA1 and MA2 positioned between the first and second active fins 105a and 105b. The plurality of merged portions MA1 and MA2 may include first merged portions MA1 and second merged portions MA2 that are alternately arranged in the direction A. The first merged portions MA1 are not completely merged and thus have a relatively curved upper surface, whereas the second merged portions MA2 may have a substantially flat upper surface.

Further, a highest point MP1' of the bottom surface of the first merged portion MA1 may be lower than a highest point MP2' of the bottom surface of the second merged portions MA2. The change in the height of the highest points MP1' and MP2' may also be repeated in a low-high-low-high manner in the direction A.

Similar to the previous embodiments, the semiconductor device 100B according to this embodiment may further include an insulating spacer 141R on a portion of the upper surface of the device isolation film 110. The insulating spacer 141R may be disposed below the second merged portions MA2, on the upper surface of the device isolation film 110, and may not be disposed below (i.e., may not be vertically overlapped by) the first merged portions MA1.

The asymmetry of the semiconductor device 100B according to this embodiment may be repeated in one direction unlike the previous example embodiments. This asymmetry will be understood as occurring, in some embodiments, due to an increase in leaning of adjacent active fins as the spacing between the plurality of active fins is narrowed.

It will be understood that components omitted or not illustrated in the semiconductor device 100B according to this embodiment may be coupled to the semiconductor device according to this embodiment with reference to the components of the previous embodiments, in detail, the embodiments illustrated in FIGS. 1 to 4. For example, in FIG. 10, the contact structure is omitted from view for simplicity of illustration, but as in the previous embodiments, the semiconductor device according to this embodiment may include a contact structure electrically connected to the source/drain region 120.

As set forth above, according to example embodiments, a highly integrated semiconductor device may be manufactured while ensuring excellent reliability, through scaling down.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
    an active region on a substrate;
    a plurality of first active fins and a plurality of second active fins each extending in a first direction on the active region, and alternately arranged in a second direction intersecting the first direction;
    a device isolation film on an upper surface of the active region and side surfaces of the plurality of first and second active fins; and
    a source/drain region on each of the plurality of first and second active fins,
    wherein each of the plurality of second active fins has an upper surface lower than an upper surface of a first active fin adjacent thereto among the plurality of first active fins, and
    wherein a second active fin among the plurality of second active fins is between ones of the plurality of first active fins in the second direction.

2. The semiconductor device of claim 1,
    wherein the source/drain region includes a plurality of merged portions between adjacent first and second fins among the plurality of first and second active fins, the plurality of merged portions including at least two first merged portions and at least one second merged portion alternately arranged along the second direction, and
    wherein a highest point of a bottom surface of each of the at least two first merged portions is lower than a highest point of a bottom surface of the at least one second merged portion.

3. The semiconductor device of claim 2, wherein a highest point of an upper surface of each of the at least two first merged portions is lower than a highest point of an upper surface of the at least one second merged portion.

4. The semiconductor device of claim 2, further comprising an insulating spacer between the adjacent first and second fins on an upper surface of the device isolation film.

5. The semiconductor device of claim 4, wherein the insulating spacer is below the at least one second merged portion and is not below the at least two first merged portions.

6. The semiconductor device of claim 4, wherein the insulating spacer includes a first portion below each of the at least two first merged portions, and a second portion below the at least one second merged portion, and the first portion has a first thickness smaller than a second thickness of the second portion.

7. The semiconductor device of claim 1,
    wherein the active region includes a plurality of active portions between adjacent first and second fins among the plurality of first and second active fins, the plurality of active portions including at least two first active portions and at least one second active portion alternately arranged along the second direction, and wherein a lowest point of an upper surface of each of the at least two first active portions is higher than a lowest point of an upper surface of the at least one second active portion.

8. The semiconductor device of claim 1, wherein a pitch of the plurality of first and second active fins is 40 nanometers (nm) or less.

9. The semiconductor device of claim 1, further comprising:
an interlayer insulating region on the device isolation film and on the source/drain region; and
a contact structure in the interlayer insulating region and electrically connected to the source/drain region,
wherein the source/drain region extends continuously on each of the plurality of first and second active fins.

10. A semiconductor device comprising:
an active region on a substrate;
a plurality of first active fins and a plurality of second active fins each extending in a first direction on the active region, and alternately arranged in a second direction intersecting the first direction;
a device isolation film on an upper surface of the active region, each of the plurality of first and second active fins having a portion protruding from an upper surface of the device isolation film; and
a source/drain region across the plurality of first and second active fins,
wherein the source/drain region includes a plurality of merged portions between adjacent first and second fins among the plurality of first and second active fins, the plurality of merged portions including at least two first merged portions and at least one second merged portion alternately arranged along the second direction,
wherein a highest point of a bottom surface of each of the at least two first merged portions is lower than a highest point of a bottom surface of the at least one second merged portion.

11. The semiconductor device of claim 10, wherein a highest point of an upper surface of each of the at least two first merged portions is lower than a highest point of an upper surface of the at least one second merged portion.

12. The semiconductor device of claim 10, further comprising an insulating spacer between the adjacent first and second fins on the upper surface of the device isolation film.

13. The semiconductor device of claim 12, wherein the insulating spacer is below the at least one second merged portion and is not below the at least two first merged portions.

14. The semiconductor device of claim 12, wherein the insulating spacer includes a first portion below each of the at least two first merged portions, and a second portion below the at least one second merged portion, and the first portion has a first thickness smaller than a second thickness of the second portion.

15. The semiconductor device of claim 10,
wherein the active region includes a plurality of active portions between adjacent first and second fins among the plurality of first and second active fins, the plurality of active portions including at least two first active portions and at least one second active portion alternately arranged along the second direction, and wherein a lowest point of an upper surface of each of the at least two first active portions is higher than a lowest point of an upper surface of the at least one second active portion.

16. A semiconductor device comprising:
an active region on a substrate;
a plurality of first active fins and a plurality of second active fins each extending in a first direction on the active region, and alternately arranged in a second direction intersecting the first direction;
a device isolation film on an upper surface of the active region, each of the plurality of first and second active fins having a portion protruding from an upper surface of the device isolation film;
a source/drain region across the plurality of first and second active fins; and
an insulating spacer between adjacent first and second fins among the plurality of first and second active fins on the upper surface of the device isolation film,
wherein each of the plurality of second active fins has an upper surface lower than an upper surface of each of the plurality of first active fins,
wherein the source/drain region includes a plurality of merged portions between adjacent first and second fins among the plurality of first and second active fins, the plurality of merged portions including at least two first merged portions and at least one second merged portion alternately arranged along the second direction,
wherein the insulating spacer is below the at least one second merged portion and is not below the at least two first merged portions.

17. The semiconductor device of claim 16, wherein the active region includes a plurality of active portions between the adjacent first and second fins, the plurality of active portions including at least two first active portions and at least one second active portion alternately arranged along the second direction, and
wherein a lowest point of an upper surface of each of the at least two first active portions is higher than a lowest point of an upper surface of the at least one second active portion.

18. The semiconductor device of claim 16, wherein a highest point of a bottom surface of each of the at least two first merged portions is lower than a highest point of a bottom surface of the at least one second merged portion, and
a highest point of an upper surface of each of the at least two first merged portions is lower than a highest point of an upper surface of the at least one second merged portion.

19. The semiconductor device of claim 16, wherein a pitch of the plurality of first and second active fins is 40 nanometers (nm) or less.

20. The semiconductor device of claim 16, further comprising:
an interlayer insulating layer on the device isolation film and on the source/drain region; and
a contact structure in the interlayer insulating region and electrically connected to the source/drain region,
wherein the device isolation film includes silicon oxide, and the insulating spacer includes silicon nitride, silicon oxynitride, silicon carbonitride, or silicon oxycarbonitride.

* * * * *